(12) United States Patent
Otsu et al.

(10) Patent No.: US 11,104,788 B2
(45) Date of Patent: Aug. 31, 2021

(54) COMPOSITION, CURED PRODUCT AND LAMINATE

(71) Applicant: DIC Corporation, Tokyo (JP)

(72) Inventors: Masato Otsu, Sakura (JP); Kazuo Arita, Sakura (JP); Etsuko Suzuki, Sakura (JP); Junji Yamaguchi, Sakura (JP); Tomohiro Shimono, Sakura (JP)

(73) Assignee: DIC Corporation, Tokyo (JP)

( * ) Notice: Subject to any disclaimer, the term of this patent is extended or adjusted under 35 U.S.C. 154(b) by 85 days.

(21) Appl. No.: 16/470,420

(22) PCT Filed: Dec. 14, 2017

(86) PCT No.: PCT/JP2017/044865
§ 371 (c)(1),
(2) Date: Jun. 17, 2019

(87) PCT Pub. No.: WO2018/116948
PCT Pub. Date: Jun. 28, 2018

(65) Prior Publication Data
US 2020/0109276 A1    Apr. 9, 2020

(30) Foreign Application Priority Data

Dec. 20, 2016 (JP) .............................. JP2016-246565

(51) Int. Cl.
| | | |
|---|---|---|
| *C08L 35/00* | (2006.01) | |
| *C08F 222/40* | (2006.01) | |
| *C08J 5/24* | (2006.01) | |
| *H01L 23/29* | (2006.01) | |
| *H05K 1/03* | (2006.01) | |

(52) U.S. Cl.
CPC ............ *C08L 35/00* (2013.01); *C08F 222/40* (2013.01); *C08J 5/24* (2013.01); *H01L 23/295* (2013.01); *H05K 1/0366* (2013.01); *H05K 1/0373* (2013.01); *C08F 222/408* (2020.02); *C08J 2335/00* (2013.01); *C08J 2463/00* (2013.01)

(58) Field of Classification Search
CPC .. C08L 35/00; C08F 222/40; C08F 2222/408; C08J 5/24; C08J 2463/00; H01L 23/295; H05K 1/0366; H05K 1/0373; C98J 2335/00

See application file for complete search history.

(56) References Cited

U.S. PATENT DOCUMENTS

| | | | |
|---|---|---|---|
| 4,742,141 A | 5/1988 | Dien et al. | |
| 5,208,306 A | * 5/1993 | Hefner | .......................... 526/256 |
| 2011/0194261 A1 | * 8/2011 | Tanaka et al. | ................. 361/748 |

FOREIGN PATENT DOCUMENTS

| | | |
|---|---|---|
| FR | 2589868 A1 | 5/1987 |
| JP | 2000-026553 A | 1/2000 |
| JP | 2010-077310 A | 4/2010 |
| JP | 2010077310 | * 4/2010 |
| JP | 2015-193628 A | 11/2015 |

OTHER PUBLICATIONS

Tang et al., Synthesis, preparation and properties of novel high-performance allyl-maleimide resins, Polymer, vol. 50, No. 6, pp. 1414-1422, (2009). (Year: 2009).*
International Search Report dated Jun. 28, 2018, issued for PCT/JP2017/044865.
Shivananda K N Gowda et al., "Synthesis and Reactivity Studies of Maleimide-epoxy Resins with Aliphatic Amines", Iranian Polymer Journal, Jan. 1, 2007, pp. 161-171. (cited in the Apr. 29, 2020 Search Report issued for EP17883745.6).
BS Rao et al, "Preparation and thermal properties of bismaleimide blends based on hydroxyphenyl maleimide", Polymer International, vol. 54, No. 8, Jan. 1, 2005, pp. 1103-1109. (cited in the Apr. 29, 2020 Search Report issued for EP17883745.6).
Haoyu Tang et al., "Synthesis, preparation and properties of novel high-performance allyl-maleimide resins", Polymer, Elsevier Science Publishers B.V, GB, vol. 50, No. 6, Mar. 6, 2009, pp. 1414-1422. (cited in the Apr. 29, 2020 Search Report issued for EP17883745.6).
Supplementary European Search Report dated Apr. 29, 2020, issued for the European Patent Application No. 17883745.6.

* cited by examiner

*Primary Examiner* — Robert D Harlan
(74) *Attorney, Agent, or Firm* — Locke Lord LLP; James E. Armstrong, IV; Nicholas J. Di Ceglie, Jr.

(57) ABSTRACT

An object of the invention is to provide a composition having excellent heat resistance and excellent adhesiveness. Moreover, another object is to provide a cured product obtained by curing the composition and a laminate containing the cured product. Furthermore, another object is to provide a heat-resistant material, a heat-resistant member, an electronic material and an electronic member each containing the composition. The objects are achieved by providing a composition including: a (meth)allyl group-containing maleimide compound having a structure having one or more benzene rings, one or more groups having a (meth)allyl group and one or more groups having a maleimide group; and a hydroxy group-containing maleimide compound having a structure having one or more benzene rings, one or more groups having a hydroxy group and one or more maleimide groups.

14 Claims, No Drawings

COMPOSITION, CURED PRODUCT AND LAMINATE

TECHNICAL FIELD

The present invention provides a composition which contains a (meth)allyl group-containing maleimide compound and a hydroxy group-containing maleimide compound and which has excellent heat resistance and excellent adhesiveness. Moreover, the invention relates to a cured product obtained by curing the composition and a laminate containing the cured product. Furthermore, the invention relates to a heat-resistant material, a heat-resistant member, an electronic material and an electronic member each containing the composition.

BACKGROUND ART

Thermosetting resins such as epoxy resins, cyanate ester resins, bismaleimide-triazine resins and benzoxazine resins are used for resin materials for electronic parts which are used for a semiconductor encapsulating material, an insulating layer for a multilayer printed circuit board or the like. Recently, in particular, for various applications, especially for the state-of-the-art applications of electronic materials, further improvement in the properties such as heat resistance, dielectric property and reliable moisture resistance is required, and materials and compositions having all these properties are desired. In particular, bismaleimides (BMIs) are superior in heat resistance (high glass transition temperature and high resistance to thermal decomposition) to the conventional epoxy resins and phenolic resins. Therefore, applications to the electronic materials are recently studied, and BMIs are drawing attention also as resin materials for next-generation devices such as SiC power semiconductors.

BMIs having a DDM (4,4'-diaminodiphenylmethane) or DDE (4,4'-diaminodiphenylether) structure are circulated in the market as highly heat-resistant resins. However, because the highly heat-resistant BMIs have high melting points and are poorly soluble in solvents, the BMIs have problems of limited applications, and the adhesiveness to a substrate is poor. Therefore, further modification and improvement in the properties are strongly desired.

CITATION LIST

Patent Literature

PTL 1: JP-A-2015-193628

SUMMARY OF INVENTION

Technical Problem

An object of the invention is to provide a composition containing specific maleimide compounds which has excellent heat resistance and excellent adhesiveness. Moreover, another object is to provide a cured product obtained by curing the composition and a laminate containing the cured product. Furthermore, another object is to provide a heat-resistant material, a heat-resistant member, an electronic material and an electronic member each containing the composition.

Solution to Problem

As a result of intensive investigation, the present inventors have found that a composition which contains a (meth)allyl group-containing maleimide compound having a specific structure and a hydroxy group-containing maleimide compound having a specific structure achieves the above objects.

That is, the invention provides a composition including: a (meth)allyl group-containing maleimide compound having a structure having one or more benzene rings, one or more groups having a (meth)allyl group and one or more groups having a maleimide group; and a hydroxy group-containing maleimide compound having a structure having one or more benzene rings, one or more groups having a hydroxy group and one or more maleimide groups and thus achieves the objects.

Moreover, the invention provides a composition including specific maleimide compounds according to the invention, a cured product including the composition and a laminate including a layer of the cured product. Furthermore, the invention provides a composition for a heat-resistant material and a composition for an electronic material, each including the composition including the specific maleimide compounds according to the invention.

Advantageous Effects of Invention

The composition of the invention, which includes a (meth)allyl group-containing maleimide compound having a specific structure and a hydroxy group-containing maleimide compound having a specific structure, has excellent heat resistance and thus can be suitably used for a heat-resistant member and an electronic member. Moreover, due to its excellent adhesiveness, the composition can be particularly suitably used for a semiconductor encapsulating material, a circuit board, a buildup film, a buildup board and the like as well as an adhesive and a resist material. Furthermore, the composition can be suitably used also for a matrix resin of a fiber-reinforced resin and is particularly suitable as a highly heat-resistant prepreg.

DESCRIPTION OF EMBODIMENTS

The invention provides a composition including: a (meth)allyl group-containing maleimide compound having a structure having one or more benzene rings, one or more groups having a (meth)allyl group and one or more groups having a maleimide group; and a hydroxy group-containing maleimide compound having a structure having one or more benzene rings, one or more groups having a hydroxy group and one or more maleimide groups.

<(Meth)allyl Group-Containing Maleimide Compound>

The (meth)allyl group-containing maleimide compound of the invention is a compound which has a structure having one or more benzene rings, one or more groups having a (meth)allyl group and one or more groups having a maleimide group and which is represented by formula (1).

[Chem. 1]

(1)

In formula (1), $n_1$ and $m_1$ are each independently an integer of 1 to 5, and Aly is a group having a (meth)allyl group represented by formula (2) below. MI is a group having a maleimide group represented by formula (3) below, and $A_1$ is a structure having one or more benzene rings.

[Chem. 2]

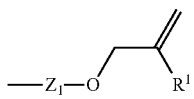
(2)

In formula (2), $Z_1$ is a direct bond or a hydrocarbon group having 1 to 10 carbon atoms which may have a substituent, and $R^1$ represents a hydrogen atom or a methyl group.

[Chem. 3]

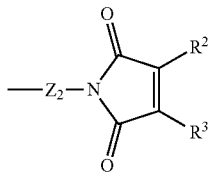
(3)

In formula (3), $Z_2$ is a direct bond or a hydrocarbon group having 1 or 2 carbon atoms which may have a substituent, and $R^2$ and $R^3$ each independently represent a hydrogen atom or a methyl group.

In this regard, because the (meth)allyl group-containing maleimide compound of the invention has one or more benzene rings, the heat resistance of the compound of the invention, especially the temperature of thermal decomposition resistance, increases. Moreover, because the glass transition temperature increases due to the maleimide group(s), the heat resistance further improves. Furthermore, because the reactivity improves and because the melting point decreases due to the (meth)allyl group(s), the handling property improves, and the compound can be suitably used for various applications.

Here, in the (meth)allyl group-containing maleimide compound of the invention, $A_1$ in formula (1) above is a structure having one or more benzene rings. Examples of the structure having one or more benzene rings include the structures shown in formula (10) below.

[Chem. 4]

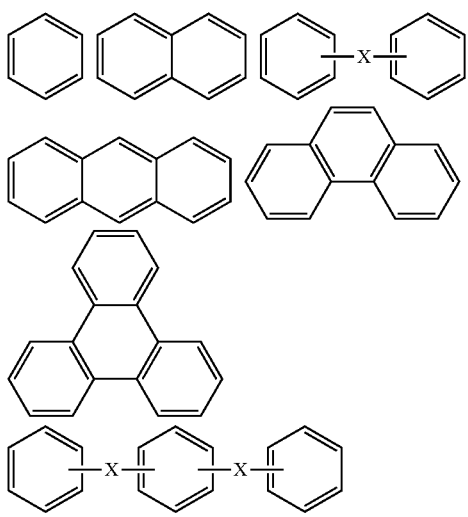
(10)

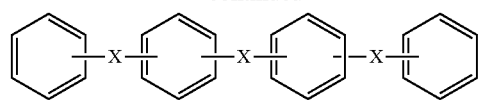

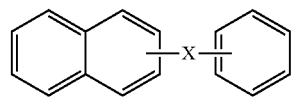

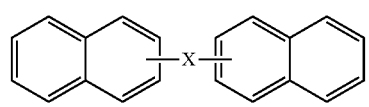

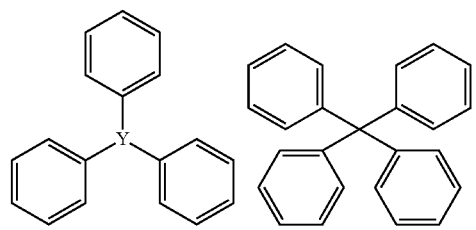

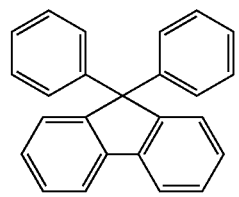

In the structures above, the benzene rings may have a substituent but may be unsubstituted, and the binding style of the substituent is not particularly limited. Moreover, when a plurality of benzene rings are present, the benzene rings may be bonded directly or bonded through a linking group, and the benzene rings may be condensed and form a condensed ring.

X in formula (10) represents a direct bond or a divalent linking group. Examples of the divalent linking group include a hydrocarbon group having 1 to 3 carbon atoms which may have a substituent, an oxygen atom, a carbonyl group, a sulfur atom, a sulfone group, a divalent alicyclic structure and the like.

Y in formula (10) represents a trivalent linking group. Examples of the trivalent linking group include a hydrocarbon group having 1 to 3 carbon atoms which has a substituent, a nitrogen atom, a trivalent alicyclic structure and the like.

Of the structures having one or more benzene rings shown in formula (10), a preferable structure is any of the structures shown in formula (11) below.

[Chem. 5]

(11)

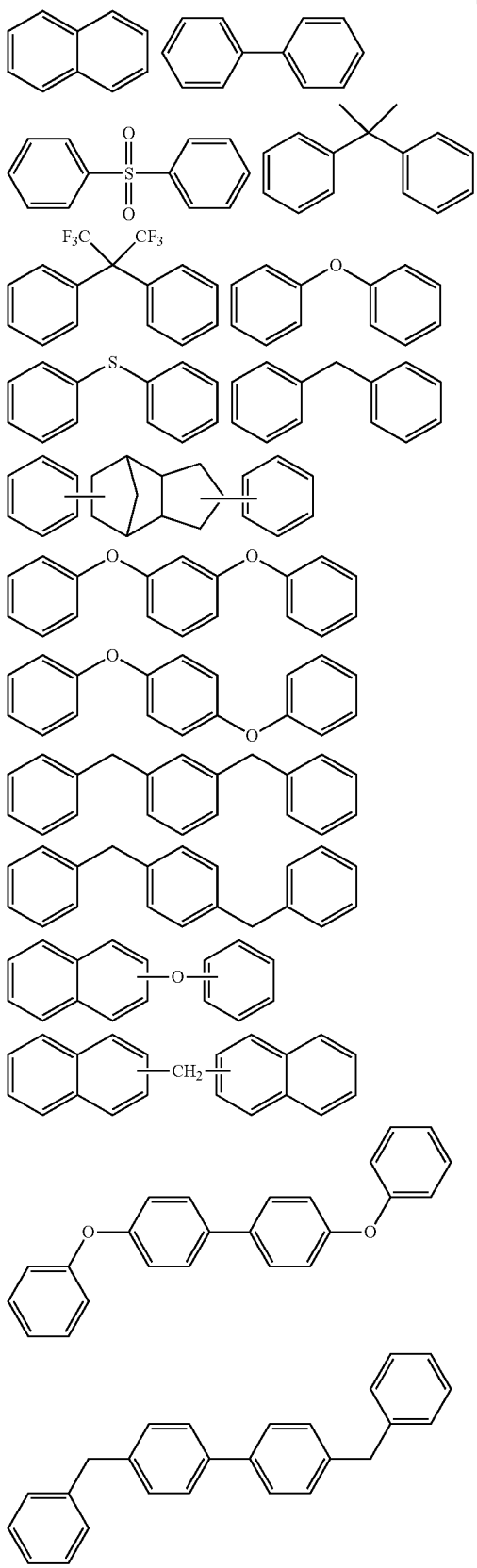

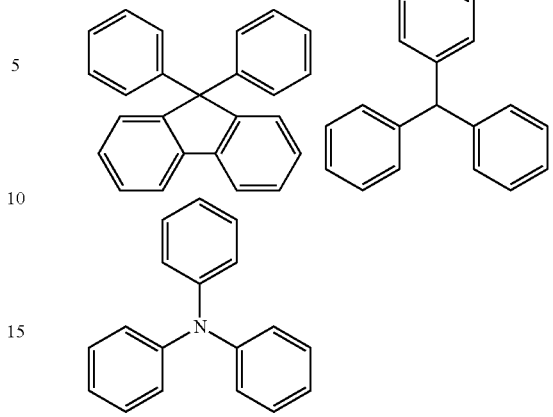

In formula (10), a hydrogen atom of any of the benzene ring structures may be replaced with a substituent within the scope that does not adversely affect the effects of the invention. The substituent is a known general substituent. Examples are a hydrocarbon group having 1-6 carbon atoms which may have a substituent, a halogen atom, a hydroxy group, an amino group, an amide group, a ureido group, a urethane group, a carboxyl group, an alkoxy group, a thioether group, an acyl group, an acyloxy group, an alkoxycarbonyl group, a cyano group, a nitro group and the like.

In formula (1), $n_1$ is an integer of 1 to 5, and $n_1$ is preferably 2 or more because the melting point decreases. Moreover, $m_1$ is an integer of 1 to 5, and $m_1$ is preferably 2 or more because the heat resistance improves.

The ratio of m and n is m:n=1:5 to 5:1. Preferably, the ratio is particularly preferably 1:2 to 2:1 because heat resistance and a low melting point can be both obtained.

The binding positions of the group(s) containing a (meth) allyl group and the group(s) containing a maleimide group are not particularly limited, but the group(s) containing a maleimide group and the group(s) containing a (meth)allyl group are preferably on a same benzene ring because the heat resistance further improves.

In formula (2), $Z_1$ represents a direct bond or a hydrocarbon group having 1 to 10 carbon atoms which may have a substituent.

Examples of the hydrocarbon group having 1 to 10 carbon atoms include alkylene groups, alkenylene groups, cycloalkylene groups, arylene groups, aralkylene groups and groups formed by a combination of more than one group thereof.

The alkylene groups are methylene group, methine group, ethylene group, propylene group, butylene group, pentylene group, hexylene group and the like.

The alkenylene groups are vinylene group, 1-methylvinylene group, propenylene group, butenylene group, pentenylene group and the like.

The alkynylene groups are ethynylene group, propynylene group, butynylene group, pentenylene group, hexynylene group and the like.

The cycloalkylene groups are cyclopropylene group, cyclobutylene group, cyclopentylene group, cyclohexylene group and the like.

The arylene groups are phenylene group, tolylene group, xylylene group, naphthylene group and the like.

In formula (2), a preferable structure of $Z_1$ is a direct bond or a methylene group.

In formula (3), $Z_2$ represents a direct bond or a hydrocarbon group having 1 or 2 carbon atoms which may have a substituent. $Z_2$ is preferably a direct bond or a methylene group.

Particularly preferable structures of the (meth)allyl group-containing maleimide compound of the invention are the structures which are shown by formulae (12-1) to (12-14) below as examples.

[Chem. 6]

(12-1)

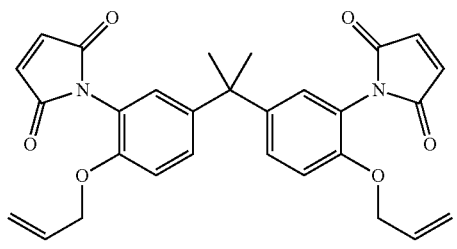

[Chem. 7]

(12-2)

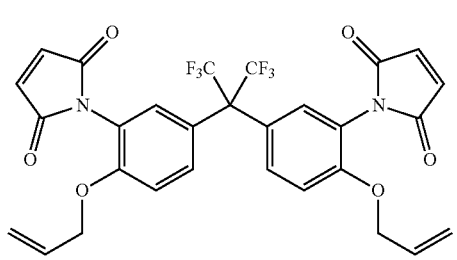

[Chem. 8]

(12-3)

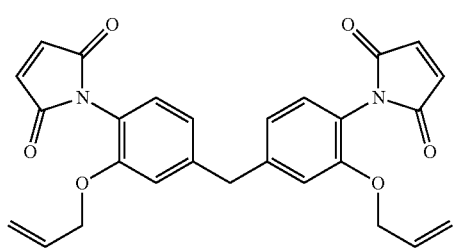

[Chem. 9]

(12-4)

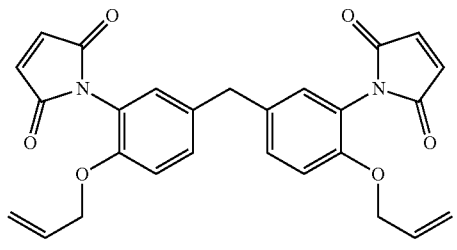

[Chem. 10]

(12-5)

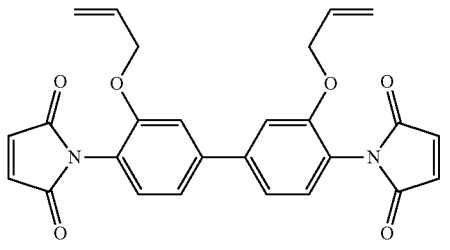

-continued

[Chem. 11]

(12-6)

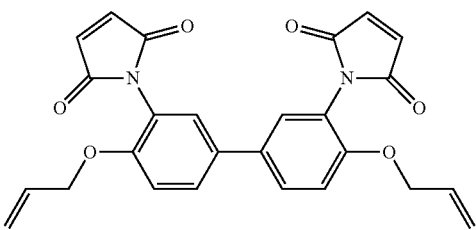

[Chem. 12]

(12-7)

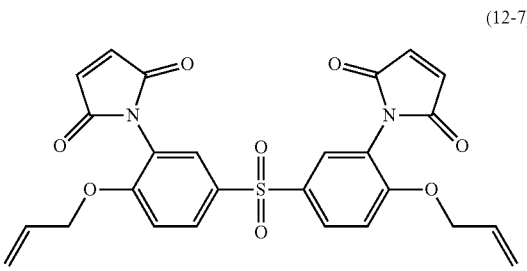

[Chem. 13]

(12-8)

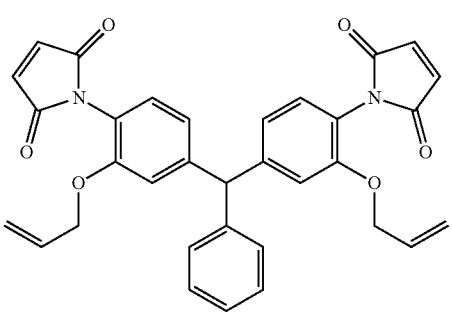

[Chem. 14]

(12-9)

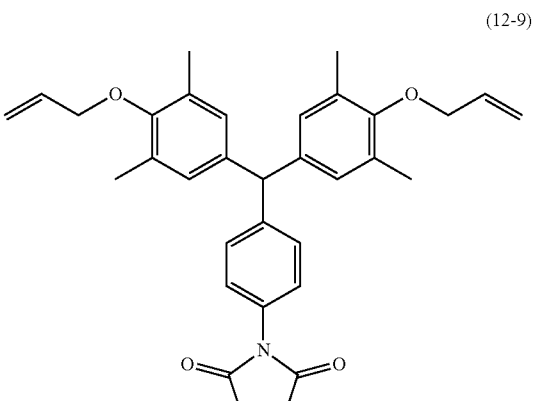

-continued

[Chem. 15]

(12-10)

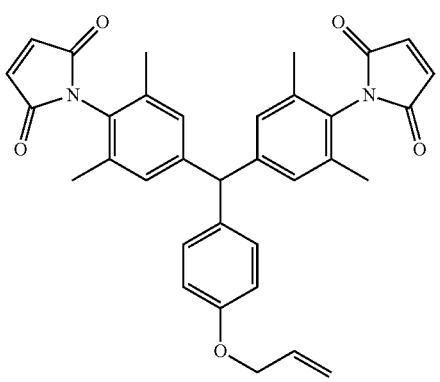

[Chem. 16]

(12-11)

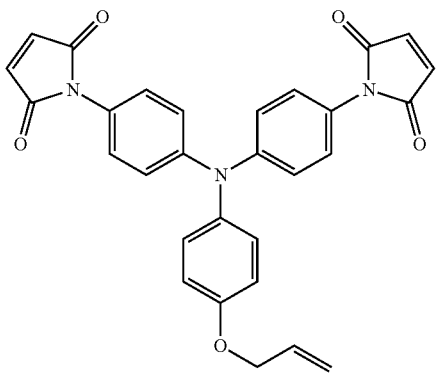

[Chem. 17]

(12-12)

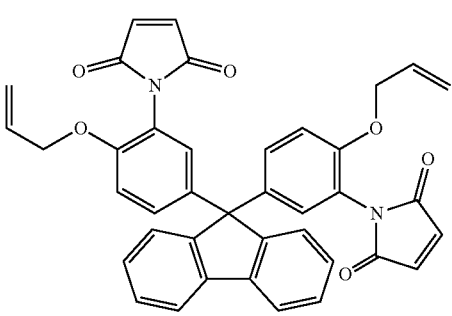

[Chem. 18]

(12-13)

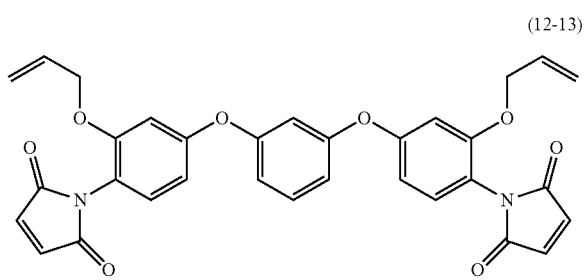

-continued

[Chem. 19]

(12-14)

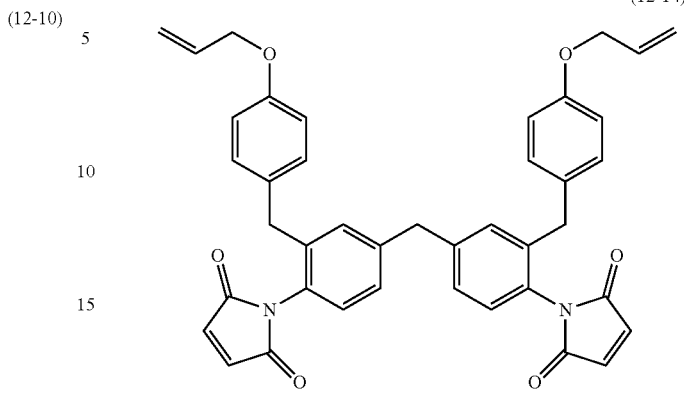

Particularly preferable structures of these structures are the structures represented by (12-1), (12-2), (12-3), (12-4), (12-5), (12-6), (12-8), (12-12) and (12-13). The group(s) containing a (meth)allyl group and the maleimide group(s) are preferably on a same benzene ring because the melting point tends to decrease. Moreover, such a structure is preferable because the heat resistance improves when the composition is cured.

<Production Method of (Meth)Allyl Group-Containing Maleimide Compound>

The method for producing the (meth)allyl group-containing maleimide compound of the invention is not particularly limited, but the compound can be produced efficiently through the following steps.

<Production Method 1>

1-1) A step of protecting the amino group of a hydroxy group-containing aromatic amino compound having a benzene ring.

1-2) A step of (meth)allylating the hydroxy group of the compound obtained in 1-1).

1-3) A step of deprotecting the protected amino group of the compound obtained in 1-2).

1-4) A step of maleimidating the amino group of the compound obtained in 1-3).

Using a hydroxy group-containing aromatic amino compound having a benzene ring, the (meth)allyl group-containing maleimide compound of the invention, which is a compound having a structure having one or more benzene rings, one or more groups having a (meth)allyl group and one or more maleimide groups, can be produced.

The hydroxy group-containing aromatic amino compound having a benzene ring is preferably a compound having any structure represented by formula (6), a hydroxy group and an amino group. Specific examples include conventionally known compounds such as 2,2-bis(3-amino-4-hydroxyphenyl) propane, 2,2-bis(3-amino-4-hydroxyphenyl)hexafluoropropane, 2,2-bis(3-amino-4-hydroxyphenyl) sulfone, 4,4'-diamino-3,3'-dihydroxybiphenyl, 3,3'-diamino-4,4'-dihydroxybiphenyl, 9,9-bis(3-amino-4-hydroxyphenyl) fluorene, 1,3-bis(4-amino-3-hydroxyphenoxy) benzene and 4,4'-diamino-4"-hydroxytriphenylamine, but the compound is not limited to these examples and may be any compound as long as the compound is a phenol compound having an amino group.

To produce the aromatic aminophenol compound, a method of nitrating and then reducing a hydroxy group-containing aromatic compound can be used.

A known general method may be used for the protection of the amino group in step 1-1), and the amino group can be protected for example by acetylation. A known general acetylating agent may be used for the acetylation, and examples include acetic anhydride, acetyl chloride and the like.

In step 1-2), for example, a (meth)allyl halide compound is reacted with the hydroxy group of the hydroxy group-containing aromatic amino compound in which the amino group has been protected in the presence of a base, and thus (meth)allylation can be caused. The (meth)allyl halide compound is (meth)allyl bromide or (meth)allyl chloride, and the base is potassium carbonate or the like.

In step 1-3) and step 1-4), the protected amino group is deprotected, and the amino group is maleimidated. The amino group can be maleimidated for example through reaction with a compound represented by formula (13) below.

[Chem. 20]

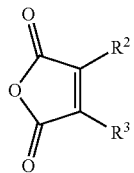

(13)

In formula (13), $R^2$ and $R^3$ each independently represent a hydrogen atom or a methyl group.

Examples of the compound represented by formula (13) include maleic anhydride, citraconic anhydride, 2,3-dimethylmaleic anhydride and the like.

Through the above steps, the (meth)allyl group-containing maleimide compound of the invention, which is a compound having a structure having one or more benzene rings, one or more groups having a (meth)allyl group and one or more groups having a maleimide group, can be produced.

When the (meth)allyl group-containing maleimide compound of the invention is synthesized, an unreacted monomer sometimes remains in the reactants, or a compound other than the (meth)allyl group-containing maleimide compound is sometimes generated as a product. Examples of the other compound are uncyclized amic acid, isoimides, monomers, oligomers of the product and the like. The substances other than the (meth)allyl group-containing maleimide compound may be removed by a purification step or may be contained also during the use depending on the application.

<Hydroxy Group-Containing Maleimide Compound>

The composition of the invention contains a hydroxy group-containing maleimide compound represented by formula (4) which has a structure having one or more benzene rings, one or more groups having a hydroxy group and one maleimide group or more in addition to the (meth)allyl group-containing maleimide compound.

[Chem. 21]

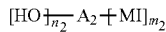

(4)

In formula (4), $n_2$ and $m_2$ are each independently an integer of 1 to 5, and MI is a group having a maleimide group represented by formula (3) above. $A_2$ is a structure having one or more benzene rings.

Because the composition of the invention contains both of the (meth)allyl group-containing maleimide compound and the hydroxy group-containing maleimide compound, the adhesiveness to a substrate improves. Moreover, because the hydroxy group-containing maleimide compound of the invention has an aromatic ring structure, the composition containing the compound is highly heat resistant.

In formula (4), $n_2$ is an integer of 1 to 5, and $m_2$ is an integer of 1 to 5.

The ratio of m and n is m:n=1:5 to 5:1. Preferably, the ratio is particularly preferably 1:2 to 2:1 because heat resistance and a low melting point can be both obtained.

The binding positions of the hydroxy group(s) and the maleimide group(s) are not particularly limited, but the maleimide group(s) and the group(s) containing a hydroxy group are preferably on a same benzene ring because the heat resistance further improves.

Particularly preferable structures of the hydroxy group-containing maleimide compound of the invention are the structures below, in which $A_2$ is a benzene ring structure and in which $n_2$ and $m_2$ are both 1.

[Chem. 22]

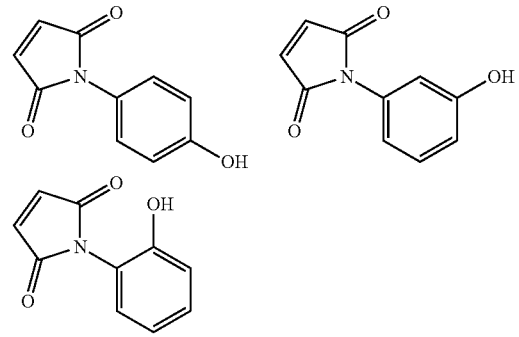

<Production Method of Hydroxy Group-Containing Maleimide Compound>

The method for producing the hydroxy group-containing maleimide compound of the invention is not particularly limited, but the hydroxy group-containing maleimide compound of the invention, which has a structure having one or more benzene ring, one or more groups having a hydroxy group and one or more maleimide groups, can be produced by maleimidating a hydroxy group-containing aromatic amino compound having a benzene ring.

The hydroxy group-containing aromatic amino compound having a benzene ring is preferably a compound having any of the structures shown in formula (10), a hydroxy group and an amino group. Specific examples include conventionally known compounds such as 2-aminophenol, 3-aminophenol, 4-aminophenol, 2,4-dihydroxyaniline, 2,6-dihydroxyaniline, 2,2-bis(3-amino-4-hydroxyphenyl)propane, 2,2-bis(3-amino-4-hydroxyphenyl)hexafluoropropane, 2,2-bis(3-amino-4-hydroxyphenyl)sulfone, 4,4'-diamino-3,3'-dihydroxybiphenyl, 3,3'-diamino-4,4'-dihydroxybiphenyl, 9,9-bis(3-amino-4-hydroxyphenyl)fluorene, 1,3-bis(4-amino-3-hydroxyphenoxy)benzene and 4,4'-diamino-4''-hydroxytriphenylamine, but the compound is not limited to these examples and may be any compound as long as the compound is a phenol compound having an amino group.

To produce the aromatic aminophenol compound, a method of nitrating and then reducing a hydroxy group-containing aromatic compound can be used.

The amino group can be maleimidated for example through reaction with a compound represented by formula (13) above.

Examples of the compound represented by formula (13) above include maleic anhydride, citraconic anhydride, 2,3-dimethylmaleic anhydride and the like.

Through the above steps, the hydroxy group-containing maleimide compound of the invention, which has a structure having one or more benzene rings, one or more groups having a hydroxy group and one or more maleimide groups, can be produced.

When the hydroxy group-containing maleimide compound of the invention is synthesized, an unreacted monomer sometimes remains in the reactants, or a compound other than the hydroxy group-containing maleimide compound is sometimes generated as a product. Examples of the other compound are uncyclized amic acid, isoimides, monomers, oligomers of the product and the like. The substances other than the hydroxy group-containing maleimide compound may be removed by a purification step or may be contained also during the use depending on the application.

<Composition>

The composition of the invention includes the (meth)allyl group-containing maleimide compound and the hydroxy group-containing maleimide compound of the invention.

Because a cured product obtained by curing the composition of the invention has excellent resistance to thermal decomposition, a high glass transition temperature and a low linear expansion coefficient, the cured product can be suitably used for a heat-resistant member. Moreover, due to its excellent adhesiveness to a substrate, the cured product can be particularly suitably used for an electronic member to which various members such as a circuit board or a terminal have to be combined.

In the composition of the invention, the blending ratio of the (meth)allyl group-containing maleimide compound and the hydroxy group-containing maleimide compound may be appropriately adjusted for use within the scope that does not adversely affect the effects of the invention, but the ratio of the invention is preferably (meth)allyl group-containing maleimide compound:hydroxy group-containing maleimide compound =1:5 to 5:1. This is because, within the range, the heat resistance and the adhesiveness are well balanced. The ratio is particularly preferably 1:2 to 4:1.

<Production Method of Composition>

The method for producing the composition of the invention including the (meth)allyl group-containing maleimide compound and the hydroxy group-containing maleimide compound is not particularly limited, and in a simple method, the (meth)allyl group-containing maleimide compound and the hydroxy group-containing maleimide compound may be mixed directly.

In order to more uniformly mix the (meth)allyl group-containing maleimide compound and the hydroxy group-containing maleimide compound, a production method having a step of producing a mixture solution by mixing the (meth)allyl group-containing maleimide compound represented by formula (1), the hydroxy group-containing maleimide compound represented by formula (4) above and a solvent and a step of removing the solvent from the obtained mixture solution can be used. By the method, a uniform composition can be produced. As a result, the two kinds of maleimide compound are dispersed at the molecular level, and the viscosities of the compounds can be made low.

To produce the mixture solution, the (meth)allyl group-containing maleimide compound and the hydroxy group-containing maleimide compound may be mixed by dissolving the compounds in one solvent.

Moreover, a method in which the (meth)allyl group-containing maleimide compound and the hydroxy group-containing maleimide compound are dissolved individually in separate solvents and in which the solutions are then mixed may also be used. At this point, the solvents in which the (meth)allyl group-containing maleimide compound and the hydroxy group-containing maleimide compound are dissolved may be different solvents as long as the solvents are compatible, and a same solvent may also be used of course.

Examples of the solvents used for producing the mixture solution include ketones such as acetone, methyl ethyl ketone (MEK) and methyl isobutyl ketone (MIBK), cyclic ethers such as tetrahydrofuran (THF) and dioxolane, esters such as methyl acetate, ethyl acetate and butyl acetate, aromatic compounds such as toluene and xylene and alcohols such as carbitol, cellosolve, methanol, isopropanol, butanol and propylene glycol monomethyl ether, and a kind thereof or a combination thereof can be used. Of these examples, ethyl acetate, methyl ethyl ketone and toluene are preferable in view of the solubility of the composition, the volatility during the evaporation of the solvent and the recovery of the solvent.

Regarding the production method of the composition, the composition can also be produced by mixing precursors of the (meth)allyl group-containing maleimide compound and the hydroxy group-containing maleimide compound and then maleimidating the precursors together. When this method is used, the synthesis steps can be made simple. Moreover, the two kinds of maleimide compound are dispersed at the molecular level, and the viscosities of the compounds can be made low.

Specifically, a composition including a (meth)allyl group-containing compound and a hydroxy group-containing maleimide compound can be produced by a production method having a step of producing an aromatic amino compound mixture by mixing a (meth)allyl group-containing amino compound represented by formula (6) below and a hydroxy group-containing amino compound represented by formula (9) below and a step of maleimidating the aromatic amino compound mixture.

[Chem. 23]

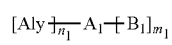 (6)

[0078]

In formula (6), $n_1$ and $m_1$ are each independently an integer of 1 to 5,

Aly is a group having a (meth)allyl group represented by formula (7) below, $B_1$ is a group having an amino group represented by formula (8) below, and $A_1$ is a structure having one or more benzene rings.

[Chem. 24]

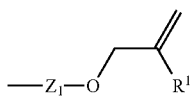
(7)

In formula (7), $Z_1$ is a direct bond or a hydrocarbon group having 1 to 10 carbon atoms which may have a substituent, and $R_1$ represents a hydrogen atom or a methyl group.

[Chem. 25]

(8)

In formula (8), $Z_2$ is a direct bond or a hydrocarbon group having 1 or 2 carbon atoms which may have a substituent, and $R^2$ and $R^3$ each independently represent a hydrogen atom or a methyl group.

[Chem. 26]

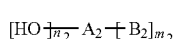
(9)

In formula (9), $n_2$ and $m_2$ are each independently an integer of 1 to 5, $B_2$ is a group having a maleimide group represented by formula (8) above, and $A_2$ is a structure having one or more benzene rings.

<Epoxy Compound>

The composition of the invention may further contain an epoxy compound. When an epoxy compound is contained, the adhesiveness to a substrate further improves. Moreover, because a complex cross-linked system is formed through the reaction of the epoxy group of the epoxy compound and the hydroxy group of the hydroxy group-containing maleimide compound and the reaction of the maleimide groups of the (meth)allyl group-containing maleimide compound and the hydroxy group-containing maleimide compound, the heat resistance further improves, and the linear expansion coefficient further lowers.

When the composition of the invention contains an epoxy compound, the blending ratio of the hydroxy group-containing maleimide compound and the epoxy compound is preferably 1:2 to 2:1 based on the ratio of the hydroxy group equivalent of the hydroxy group-containing maleimide compound and the epoxy equivalent in view of the curability and the heat resistance. The ratio is particularly preferably 1:1.5 to 1.5:1.

Examples of the epoxy compound of the invention include an epoxy resin and a phenoxy resin. The epoxy resin is not particularly limited as long as the resin has an epoxy group, and examples include bisphenol A-type epoxy resin, bisphenol F-type epoxy resin, bisphenol E-type epoxy resin, bisphenol S-type epoxy resin, bisphenol sulfide-type epoxy resin, phenylene ether-type epoxy resin, naphthylene ether-type epoxy resin, biphenyl-type epoxy resin, tetramethylbiphenyl-type epoxy resin, polyhydroxynaphthalene-type epoxy resin, naphthalene-type epoxy resin, phenol novolak-type epoxy resin, cresol novolak-type epoxy resin, triphenylmethane-type epoxy resin, tetraphenylethane-type epoxy resin, dicyclopentadiene-phenol addition reaction-type epoxy resin, phenol aralkyl-type epoxy resin, naphthol novolak-type epoxy resin, naphthol aralkyl-type epoxy resin, naphthol-phenol co-condensed novolak-type epoxy resin, naphthol-cresol co-condensed novolak-type epoxy resin, aromatic hydrocarbon formaldehyde resin-modified phenolic resin-type epoxy resin, biphenyl-modified novolak-type epoxy resin, anthracene-type epoxy resin and the like. A kind thereof may be used, or two or more kinds thereof may be used in combination.

The phenoxy resin refers to a high-molecular-weight thermoplastic polyether resin based on diphenol and an epihalohydrin such as epichlorohydrin, and the weight average molecular weight is preferably 20,000 to 100,000. Examples of the structure of the phenoxy resin include structures having one or more structures selected from bisphenol A structure, bisphenol F structure, bisphenol S structure, bisphenol acetophenone structure, novolakstructure, biphenyl structure, fluorene structure, dicyclopentadiene structure, norbornene structure, naphthalene structure, anthracene structure, adamantane structure, terpene structure and trimethylcyclohexane structure.

Of the epoxy compounds, an aromatic epoxy compound is preferable, and a polycyclic aromatic epoxy compound having more than one aromatic ring is further preferable.

As preferable epoxy compounds, the following structures can be mentioned.

[Chem. 27]

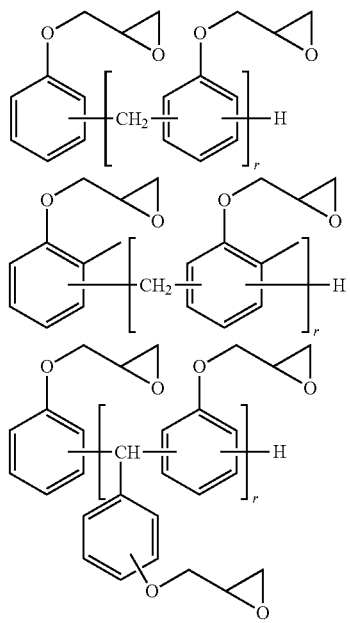

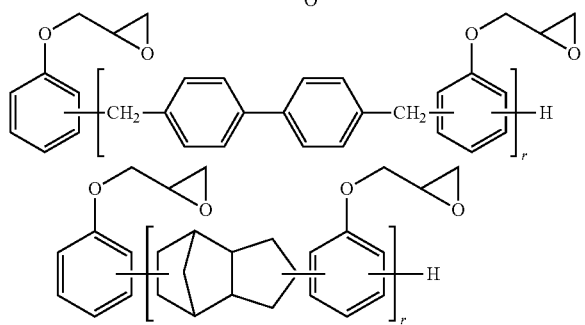

-continued

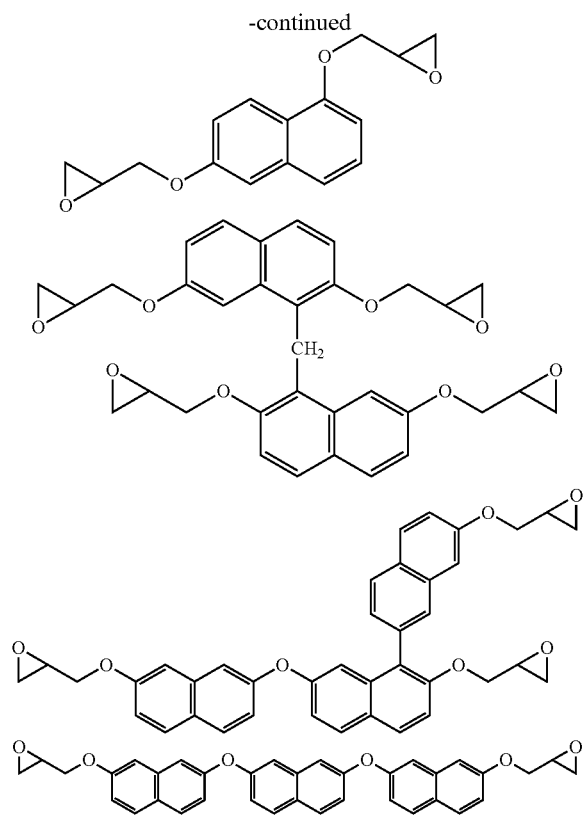

In the formulae, r is an average of repeated units and is 1 to 10.

<Filler>

The composition of the invention may further contain a filler. The filler is an inorganic filler or an organic filler. An example of the inorganic filler is inorganic fine particles.

Examples of the inorganic fine particles are as follows: alumina, magnesia, titania, zirconia, silica (quartz, fumed silica, precipitated silica, silicic anhydride, fused silica, crystalline silica, ultrafine powder amorphous silica or like) and the like, which have excellent heat resistance; boron nitride, aluminum nitride, alumina oxide, titanium oxide, magnesium oxide, zinc oxide, silicon oxide, diamond and the like, which have excellent thermal conductivity; metal fillers and/or metal-coated fillers using a single metal or an alloy (for example, iron, copper, magnesium, aluminum, gold, silver, platinum, zinc, manganese, stainless steel or the like), which have excellent electrical conductivity; minerals such as mica, clay, kaolin, talc, zeolite, wollastonite and smectite, potassium titanate, magnesium sulfate, sepiolite, zonolite, aluminum borate, calcium carbonate, titanium oxide, barium sulfate, zinc oxide and magnesium hydroxide, which have excellent barrier properties; barium titanate, zirconia oxide, titanium oxide and the like, which have high refractive indexes; photocatalyst metals such as titanium, cerium, zinc, copper, aluminum, tin, indium, phosphorus, carbon, sulfur, tellurium, nickel, iron, cobalt, silver, molybdenum, strontium, chromium, barium and lead, composites of the metals, oxides thereof and the like, which exhibit photocatalytic properties; metals such as silica, alumina, zirconia and magnesium oxide, composites thereof, oxides thereof and the like, which have excellent abrasion resistance; metals such as silver and copper, tin oxide, indium oxide and the like, which have excellent electrical conductivity; silica and the like, which have excellent insulating properties; and titanium oxide, zinc oxide and the like, which have excellent ultraviolet shielding properties.

The inorganic fine particles may be timely selected depending on the application. A kind thereof may be used, or more than one kind thereof may be used in combination. Moreover, because the inorganic fine particles have various characteristics in addition to the characteristics described in the examples, the inorganic fine particles may be timely selected depending on the application.

For example, when silica is used as the inorganic fine particles, known silica fine particles such as powdered silica and colloidal silica can be used without any particular limitation. Examples of commercial powdered silica fine particles include Aerosil 50 and 200 manufactured by Nippon Aerosil Co., Ltd., Shieldex H31, H32, H51 H52, H121 and H122 manufactured by AGC Inc., E220A and E220 manufactured by Nippon Silica Industrial Co., Ltd., SYLYSIA470 manufactured by Fuji Silysia Chemical Ltd., SG Flake manufactured by Nippon Sheet Glass Co., Ltd and the like.

Moreover, examples of commercial colloidal silica include methanol silica sols, IPA-ST, MEK-ST, NBA-ST, XBA-ST, DMAC-ST, ST-UP, ST-OUP, ST-20, ST-40, ST-C, ST-N, ST-O, ST-50 and ST-OL manufactured by Nissan Chemical Industries, Ltd. and the like.

Silica fine particles with modified surface may also be used, and examples include those obtained by surface treatment of the silica fine particles with a reactive silane coupling agent having a hydrophobic group and those modified with a compound having a (meth)acryloyl group. Examples of commercial powdered silica modified with a compound having a (meth)acryloyl group include Aerosil RM50 and R711 manufactured by Nippon Aerosil Co., Ltd. and the like, and examples of commercial colloidal silica modified with a compound having a (meth)acryloyl group include MIBK-SD manufactured by Nissan Chemical Industries, Ltd. and the like.

The shape of the silica fine particles is not particularly limited, and silica fine particles having a spherical shape, a hollow shape, a porous shape, a roll shape, a sheet shape, a fibrous shape or an unformed state can be used. Moreover, the primary particle size is preferably in the range of 5 to 200 nm. When the primary particle size is less than nm, the inorganic fine particles are dispersed insufficiently in the dispersing element, while the sufficient strength of the cured product may not be maintained with a size exceeding 200 nm.

As the titanium oxide fine particles, not only extender pigments but also ultraviolet light-responsive photocatalysts can be used, and for example, anatase titanium oxide, rutile titanium oxide, brookite titanium oxide and the like can be used. Furthermore, particles which are designed to respond to visible light by doping a different kind of element in the crystal structure of titanium oxide can also be used. As the element doped in titanium oxide, anionic elements such as nitrogen, sulfur, carbon, fluorine and phosphorus and cationic elements such as chromium, iron, cobalt and manganese are suitably used. Moreover, regarding the form, powder, sol obtained by dispersing in an organic solvent or in water or slurry can be used. Examples of commercial powdered titanium oxide fine particles include Aerosil P-25 manufactured by Nippon Aerosil Co., Ltd., ATM-100 manufactured by Tayca Corporation and the like. Moreover, examples of commercial slurry titanium oxide fine particles include TKD-701 manufactured by Tayca Corporation and the like.

\<Fibrous Substrate\>

The composition of the invention may further contain a fibrous substrate. The fibrous substrate of the invention is not particularly limited, but the fibrous substrate is preferably a fibrous substrate used for a fiber-reinforced resin and is formed with inorganic fibers or organic fibers.

Examples of the inorganic fibers include inorganic fibers such as carbon fibers, glass fibers, boron fibers, alumina fibers and silicon carbide fibers as well as mineral fibers such as carbon fibers, activated carbon fibers, graphite fibers, glass fibers, tungsten carbide fibers, silicon carbide fibers, ceramic fibers, alumina fibers, natural fibers and basalt, boron fibers, boron nitride fibers, boron carbide fibers, metal fibers and the like. Examples of the metal fibers include aluminum fibers, copper fibers, brass fibers, stainless steel fibers and steel fibers.

Examples of the organic fibers include synthetic fibers made of resin materials such as polybenzazole, aramid, PBO (poly-para-phenylenebenzoxazole), polyphenylenesulfide, polyesters, acryls, polyamides, polyolefins, polyvinyl alcohols and polyarylates, natural fibers such as cellulose, pulp, cotton, wool and silk, regenerated fibers of proteins, polypeptides, alginic acid or the like and the like.

Of these examples, carbon fibers and glass fibers are preferable because their ranges of industrial applications are broad. A kind thereof may be used, or more than one kind thereof may be used at the same time.

The fibrous substrate of the invention may be an aggregate of fibers, and the fibers may be continuous or discontinuous. The fibrous substrate may be a woven cloth or a nonwoven cloth. Moreover, the fibrous substrate may be a fiber bundle in which fibers are aligned in one direction or a sheet in which fiber bundles are aligned. Moreover, the fibrous substrate may have a three-dimensional shape of a thick aggregate of fibers.

\<Reactive Compound\>

The composition of the invention may contain a reactive compound in addition to the (meth)allyl group-containing maleimide compound and the hydroxy group-containing maleimide compound of the invention and the epoxy compound described above. By adding a reactive compound, various features such as reactivity, heat resistance and handling property can be given to the resin.

The reactive compound here is a compound having a reactive group and may be a monomer, an oligomer or a polymer.

The reactive group may be a functional group which does not react with the (meth)allyl group-containing maleimide compound and the hydroxy group-containing maleimide compound of the invention and the epoxy compound described above or a functional group which reacts with the compounds, but to further improve the heat resistance, a functional group which reacts with the (meth)allyl group-containing maleimide compound and the hydroxy group-containing maleimide compound of the invention and the epoxy compound described above is preferable. Examples include a cyanato group, a maleimide group, a phenolic hydroxy group, an oxazine ring, an amino group and a group having a carbon-carbon double bond.

An example of the compound having a cyanato group is a cyanate ester resin.

Examples of the compound having a maleimide group include a maleimide resin and a bismaleimide resin.

Examples of the compound having a phenolic hydroxy group include a phenol novolak resin, a cresol novolak resin, a dicyclopentadiene-modified phenolic resin, a phenol aralkyl resin, a naphthol aralkyl resin and a biphenyl aralkyl resin.

An example of the compound having an oxazine ring is benzoxazine obtained by reacting a phenol compound and an aromatic amino compound with formaldehyde. The phenol compound and the aromatic amino compound may have a reactive functional group in their structures.

Examples of the compound having an amino group include aromatic amino compounds such as DDM (4,4'-diaminodiphenylmethane), DDE (4,4'-diaminodiphenylether), 3,4'-diaminodiphenylether, 2,2-{bis4-(4-aminophenoxy)phenyl}propane and 4,4'-bis(4-aminophenoxy) biphenyl.

Examples of the compound having a group having a carbon-carbon double bond include a maleimide compound, a vinyl compound, a (meth)allyl compound and the like.

The reactive compound may have only one kind of reactive group or more than one kind, and the number of the functional groups may be one or more. Moreover, more than one kind thereof may be used at the same time.

Preferable reactive compounds area cyanate ester resin, a maleimide compound, a vinyl compound, an aromatic amino compound and the like.

Of these compounds, a maleimide compound, a cyanate ester resin and an aromatic amino compound are particularly preferable.

The crosslink density of a maleimide compound increases through self-addition reaction of the maleimide groups and in reaction of the allyl group and the maleimide group with the (meth)allyl group-containing maleimide compound of the invention. As a result, the heat resistance, especially the glass transition temperature, increases.

To obtain a uniform cured product using a maleimide compound, curing conditions at a high temperature for a long time are generally required, and thus a peroxide catalyst is often used in combination to promote the reaction. However, when the allyl group-containing maleimide compound of the invention is used, the curing reaction progresses, and a uniform cured product can be obtained also without using the catalyst. When a peroxide catalyst is used, problems such as an increase in the viscosity of the composition, a decrease in the pot life and deterioration of physical properties due to a small amount of the peroxide remaining in the cured product arise. However, the allyl group-containing maleimide compound of the invention does not require the use of a peroxide curing agent and thus can solve the problems.

A cured product obtained using a cyanate ester resin and the (meth)allyl group-containing maleimide compound of the invention exhibits excellent dielectric property.

When an aromatic amino compound is used, the crosslink density increases through Michael addition reaction of the amino group and the maleimide group, and the temperature of thermal decomposition resistance and the glass transition temperature increase.

Examples of the cyanate ester resin include bisphenol A-type cyanate ester resin, bisphenol F-type cyanate ester resin, bisphenol E-type cyanate ester resin, bisphenol S-type cyanate ester resin, bisphenol sulfide-type cyanate ester resin, phenylene ether-type cyanate ester resin, naphthylene ether-type cyanate ester resin, biphenyl-type cyanate ester resin, tetramethylbiphenyl-type cyanate ester resin, polyhydroxynaphthalene-type cyanate ester resin, phenol novolak-type cyanate ester resin, cresol novolak-type cyanate ester resin, triphenylmethane-type cyanate ester resin, tetraphenylethane-type cyanate ester resin, dicyclopentadiene-phenol addition reaction-type cyanate ester resin, phenol aralkyl-type cyanate ester resin, naphthol novolak-type cyanate ester resin, naphthol aralkyl-type cyanate ester resin, naphthol-phenol co-condensed novolak-type cyanate ester resin, naphthol-cresol co-condensed novolak-type cyanate ester resin, aromatic hydrocarbon formaldehyde resin-modified phenolic resin-type cyanate ester resin, biphenyl-modified novolak-type cyanate ester resin, anthracene-type cyanate ester resin and the like. A kind thereof may be used, or two or more kinds thereof may be used in combination.

Of the cyanate ester resins, bisphenol A-type cyanate ester resin, bisphenol F-type cyanate ester resin, bisphenol E-type cyanate ester resin, polyhydroxynaphthalene-type cyanate ester resin, naphthylene ether-type cyanate ester resin or novolak-type cyanate ester resin is preferably used because a cured product having particularly excellent heat resistance is obtained, and dicyclopentadiene-phenol addition reaction-type cyanate ester resin is preferable because a cured product having excellent dielectric property is obtained.

Examples of the maleimide compound include the compounds represented by any of structural formulae (i) to (iii) below and the like.

[Chem. 28]

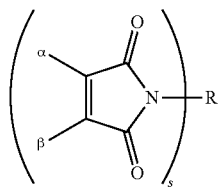

(i)

In the formula, R is an m-valent organic group, α and β are each any of a hydrogen atom, a halogen atom, an alkyl group and an aryl group, and s is an integer of 1 or more.

[Chem. 29]

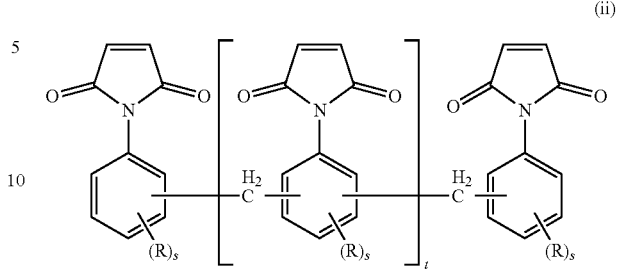

(ii)

In the formula, R is any of a hydrogen atom, an alkyl group, an aryl group, an aralkyl group, a halogen atom, a hydroxy group and an alkoxy group, s is an integer of 1 to 3, and t is the average of repeated units and is 0 to 10.

[Chem. 30]

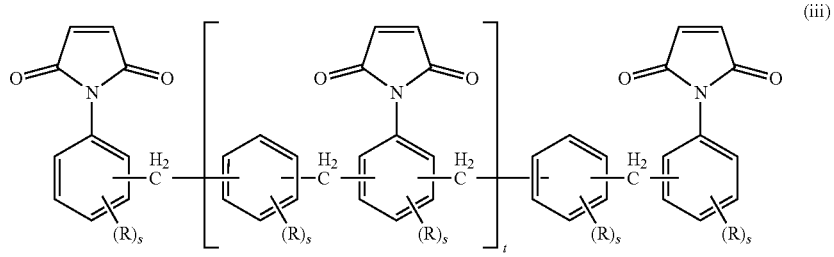

(iii)

In the formula, R is any of a hydrogen atom, an alkyl group, an aryl group, an aralkyl group, a halogen atom, a hydroxy group and an alkoxy group, and s is an integer of 1 to 3. t is the average of repeated units and is 0 to 10.) A kind thereof may be used, or two or more kinds thereof may be used in combination.

The oxazine compound is not particularly limited, but examples include a reaction product of bisphenol F, formalin and aniline (F-a-type benzoxazine resin), a reaction product of 4,4'-diaminodiphenylmethane, formalin and phenol (P-d-type benzoxazine resin), a reaction product of bisphenol A, formalin and aniline, a reaction product of dihydroxydiphenyl ether, formalin and aniline, a reaction product of diaminodiphenyl ether, formalin and phenol, a reaction product of a dicyclopentadiene-phenol addition-type resin, formalin and aniline, a reaction product of phenolphthalein, formalin and aniline, a reaction product of dihydroxydiphenyl sulfide, formalin and aniline and the like. A kind thereof may be used, or two or more kinds thereof may be used in combination.

Examples of the vinyl compound include alkyl (meth)acrylates having an alkyl group having 1 to 22 carbon atoms such as methyl (meth)acrylate, ethyl (meth)acrylate, n-propyl (meth)acrylate, n-butyl (meth)acrylate, isobutyl (meth)acrylate, tert-butyl (meth)acrylate, 2-ethylhexyl (meth)acrylate and lauryl (meth)acrylate; aralkyl (meth)acrylates such as benzyl (meth)acrylate and 2-phenylethyl (meth)acrylate; cycloalkyl (meth)acrylates such as cyclohexyl (meth)acrylate and isobornyl (meth)acrylate; ω-alkoxyalkyl (meth)acrylates such as 2-methoxyethyl (meth)acrylate and 4-methoxybutyl (meth)acrylate; vinyl carboxylates such as vinyl acetate, vinyl propionate, vinyl pivalate and vinyl benzoate; alkyl crotonates such as methyl crotonate and ethyl crotonate; dialkyl unsaturated dibasic acid esters such as dimethyl maleate, di-n-butyl maleate, dimethyl fumarate and dimethyl itaconate; α-olefins such as ethylene and propylene; fluoroolefins such as vinylidene fluoride, tetrafluoroethylene, hexafluoropropylene and chlorotrifluoroethylene; alkyl vinyl ethers such as ethyl vinyl ether and n-butyl vinyl ether; cycloalkyl vinyl ethers such as cyclopentyl vinyl ether and cyclohexyl vinyl ether; tertiary amide group-containing monomers such as N,N-dimethyl(meth) acrylamide, N—(meth)acryloylmorpholine, N—(meth) acryloylpyrrolidine and N-vinylpyrrolidone and the like.

Examples of the (meth)allyl compound include allyl esters such as allyl acetate, allyl chloride, allyl caproate, allyl caprylate, allyl laurate, allyl palmitate, allyl stearate, allyl benzoate, allyl acetoacetate and allyl lactate; allyloxy alcohols such as allyloxy methanol and allyloxy ethanol; compounds containing two allyl groups such as diallyl phthalate, diallyl isophthalate, diallyl cyanurate, diallyl isocyanurate, pentaerythritol diallyl ether, trimethylolpropane diallyl ether, glycerin diallyl ether, bisphenol A diallyl ether, bisphenol F diallyl ether, ethylene glycol diallyl ether, diethylene glycol diallyl ether, triethylene glycol diallyl ether, propylene glycol diallyl ether, dipropylene glycol diallyl ether and tripropylene glycol diallyl ether; compounds containing three allyl groups or more such as triallyl isocyanurate, pentaerythritol triallyl ether, pentaerythritol tetraallyl ether and trimethylolpropane triallyl ether; and the like or methallyl forms of these compounds.

In the composition of the invention, both maleimide groups and (meth)allyl group(s) are contained. The ratio of the maleimide groups and the (meth)allyl group(s) is not particularly limited, but the mole number of maleimide groups:mole number of (meth)allyl group(s) is preferably 1:10 to 10:1. The ratio is preferably 1:5 to 5:1 because the heat resistance is excellent. In particular, the ratio is preferably 1:2 to 3:1 because the heat resistance and the viscosity of the composition are well balanced.

<Dispersion Medium>

For the composition of the invention, a dispersion medium may be used for the purpose of adjusting the solid content of the composition and its viscosity. The dispersion medium is a liquid medium which does not adversely affect the effects of the invention, and examples include an organic solvent, a liquid organic polymer and the like.

Examples of the organic solvent include ketones such as acetone, methyl ethyl ketone (MEK) and methyl isobutyl ketone (MIBK), cyclic ethers such as tetrahydrofuran(THF) and dioxolane, esters such as methyl acetate, ethyl acetate and butyl acetate, aromatic compounds such as toluene and xylene and alcohols such as carbitol, cellosolve, methanol, isopropanol, butanol and propylene glycol monomethyl ether, and a kind thereof or a combination thereof can be used. Of the examples, methyl ethyl ketone is preferable in view of the volatility during coating and the recovery of the solvent.

The liquid organic polymer is a liquid organic polymer which does not directly contribute to the curing reaction, and examples include a carboxyl group-containing modified polymer (Flowlen G-900 and NC-500: Kyoeisha Chemical Co., Ltd.), an acrylic polymer (Flowlen WK-20: Kyoeisha Chemical Co., Ltd.), an amine salt of a specially modified phosphoric acid ester (HIPLAAD ED-251: Kusumoto Chemicals, Ltd.), a modified acrylic block copolymer (DISPERBYK2000; BYK-Chemie GmbH) and the like.

<Resin>

Moreover, the composition of the invention may have a resin other than the compounds of the invention described above. As the resin, a known general resin may be blended within the scope that does not adversely affect the effects of the invention, and for example, a thermosetting resin and a thermoplastic resin can be used.

The thermosetting resin is a resin which has features capable of becoming substantially insoluble and infusible when the resin is cured by means such as heat, radiation or a catalyst. Specific examples thereof include a phenolic resin, a urea resin, a melamine resin, a benzoguanamine resin, an alkyd resin, an unsaturated polyester resin, a vinyl ester resin, a diallyl terephthalate resin, an epoxy resin, a silicone resin, a urethane resin, a furan resin, a ketone resin, a xylene resin, a thermosetting polyimide resin, a benzoxazine resin, an active ester resin, an aniline resin, a cyanate ester resin, a styrene/maleic anhydride (SMA) resin, a maleimide resin other than the allyl group-containing maleimide compound obtained by the invention and the like. A kind of the thermosetting resins or a combination of two or more kinds thereof can be used.

The thermoplastic resin refers to a resin which can be melt-formed by heating. Specific examples thereof include a polyethylene resin, a polypropylene resin, a polystyrene resin, a rubber-modified polystyrene resin, an acrylonitrile-butadiene-styrene (ABS) resin, an acrylonitrile-styrene (AS) resin, a polymethyl methacrylate resin, an acrylic resin, a polyvinyl chloride resin, a polyvinylidene chloride resin, a polyethylene terephthalate resin, an ethylene vinyl alcohol resin, a cellulose acetate resin, an ionomer resin, a polyacrylonitrile resin, a polyamide resin, a polyacetal resin, a polybutylene terephthalate resin, a polylactic acid resin, a polyphenylene ether resin, a modified polyphenylene ether resin, a polycarbonate resin, a polysulfone resin, a polyphenylene sulfide resin, a polyetherimide resin, a polyether sulfone resin, a polyarylate resin, a thermoplastic polyimide resin, a polyamideimide resin, a polyether ether ketone resin, a polyketone resin, a liquid crystal polyester resin, a fluororesin, a syndiotactic polystyrene resin, a cyclic polyolefin resin and the like. A kind of the thermoplastic resins or a combination of two or more kinds thereof can be used.

<Curing Agent>

For the composition of the invention, a curing agent may be used depending on the blended materials. For example, when a compound having an epoxy group is contained, curing agents such as an amine curing agent, an amide curing agent, an acid anhydride curing agent, a phenol curing agent, an active ester curing agent, a carboxyl group-containing curing agent and a thiol curing agent may be used in combination.

Examples of the amine curing agent include diaminodiphenylmethane, diaminodiphenylethane, diaminodiphenyl ether, diaminodiphenyl sulfone, ortho-phenylenediamine, meta-phenylenediamine, para-phenylenediamine, meta-xylenediamine, para-xylenediamine, diethyltoluenediamine, diethylenetriamine, triethylenetetramine, isophoronediamine, imidazole, a BF3-amine complex, a guanidine derivative, a guanamine derivative and the like.

Examples of the amide curing agent include dicyandiamide, a polyamide resin synthesized from a dimer of linolenic acid and ethylenediamine and the like.

Examples of the acid anhydride curing agent include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride and the like.

Examples of the phenol curing agent include polyphenol compounds such as bisphenol A, bisphenol F, bisphenol S, resorcin, catechol, hydroquinone, fluorene bisphenol, 4,4'-biphenol, 4,4',4"-trihydroxytriphenylmethane, naphthalenediol, 1,1,2,2-tetrakis(4-hydroxyphenyl) ethane, calixarene, a phenol novolak resin, a cresol novolak resin, an aromatic hydrocarbon formaldehyde resin-modified phenolic resin, a dicyclopentadiene phenol addition-type resin, a phenol aralkyl resin (Xylok resin), a polyphenol novolak resin synthesized from a polyhydric hydroxy compound and formaldehyde such as a resorcin novolak resin, a naphthol aralkyl resin, a trimethylolmethane resin, a tetraphenylethane resin, a naphthol novolak resin, a naphthol-phenol co-condensed novolak resin, a naphthol-cresol co-condensed novolak resin, a biphenyl-modified phenolic resin (a polyphenol compound in which phenol nuclei are linked with a bismethylene group), a biphenyl-modified naphthol resin (a polynaphthol compound in which phenol nuclei are linked with a bismethylene group), an aminotriazine-modified phenolic resin (a polyphenol compound in which phenol nuclei are linked with melamine, benzoguanamine or the like) and an alkoxy group-containing aromatic ring-modified novolak resin (a polyphenol compound in which a phenol nucleus and an alkoxy group-containing aromatic ring are linked with formaldehyde).

A kind of the curing agents or a combination of two or more kinds thereof may be used.

Moreover, when the composition of the invention contains a compound having an epoxy group, a curing accelerator can also be used alone or in combination with the curing agent. As the curing accelerator, various compounds which promote the curing reaction of an epoxy resin can be used, and examples include a phosphorus compound, a tertiary amine compound, an imidazole compound, a metal salt of an organic acid, a Lewis acid, an amine complex salt and the like. Of the examples, an imidazole compound, a phosphorus compound or a tertiary amine compound is preferably used, and 2-ethyl-4-methyl-imidazole of imidazole compounds, triphenylphosphine of phosphorus compounds and N,N-dimethyl-4-aminopyridine (DMAP) and 1,8-diazabicyclo-[5.4.0]-undecene (DBU) of tertiary amines are particularly preferable for the use in applications of semiconductor encapsulating materials because the curability, the heat resistance, the electrical properties, the moisture resistance reliability and the like are excellent.

<Other Blended Material>

The composition of the invention may contain another blended material. Examples include a catalyst, a polymerization initiator, an inorganic pigment, an organic pigment, an extender pigment, a clay mineral, a wax, a surfactant, a stabilizing agent, a fluidity modifier, a coupling agent, a dye, a leveling agent, a rheology controller, an ultraviolet absorber, an antioxidant, a flame retardant, a plasticizer and the like.

<Cured Product>

A cured product obtained by curing the composition of the invention has a low linear expansion coefficient, a high glass transition temperature and excellent resistance to thermal decomposition and thus can be suitably used as a heat-resistant member. Moreover, due to the excellent adhesiveness to a substrate, the cured product can be suitably used for an electronic member. The method for forming the cured product is not particularly limited, and the composition may be formed alone or formed into a laminate by laminating with a substrate.

When the composition of the invention is cured, the composition may be thermally cured. For thermal curing, a known general curing catalyst may be used, but the composition of the invention can be cured without the use of a curing catalyst because of the reaction of the maleimide groups and the allyl group.

For thermal curing, the composition may be cured by one heating process or may be cured through a multi-stage heating step.

When a curing catalyst is used, for example, inorganic acids such as hydrochloric acid, sulfuric acid and phosphoric acid; organic acids such as p-toluenesulfonic acid, monoisopropyl phosphate and acetic acid; inorganic bases such as sodium hydroxide and potassium hydroxide; titanate esters such as tetraisopropyl titanate and tetrabutyl titanate; compounds containing a basic nitrogen atom such as 1,8-diazabicyclo[5.4.0]undecene-7 (DBU), 1,5-diazabicyclo[4.3.0]nonene-5 (DBN), 1,4-diazabicyclo[2.2.2]octane (DABCO), tri-n-butylamine, dimethylbenzylamine, monoethanolamine, imidazole, 2-ethyl-4-methyl-imidazole, 1-methylimidazole and N,N-dimethyl-4-aminopyridine (DMAP); quaternary ammonium salts which have chloride, bromide, carboxylate, hydroxide or the like as a counter anion, such as tetramethyl ammonium salt, tetrabutyl ammonium salt and dilauryldimethyl ammonium salt; tin carboxylates such as dibutyltin diacetate, dibutyltin dioctoate, dibutyltin dilaurate, dibutyltin diacetylacetonate, tin octylate or tin stearate; organic peroxides such as benzoyl peroxide, cumene hydroperoxide, dicumyl peroxide, lauroyl peroxide, di-t-butyl peroxide, t-butyl hydroperoxide, methyl ethyl ketone peroxide, t-butylperbenzoate and the like can be used. A kind of the catalysts may be used, or two or more kinds thereof may be used in combination.

Moreover, because the (meth)allyl group-containing maleimide compound of the invention has a carbon-carbon double bond, curing by active energy rays can also be used in combination. When curing by active energy rays is conducted, a photopolymerization initiator may be added to the composition. A known photopolymerization initiator can be used as the photopolymerization initiator, and for example, one or more kinds selected from the group consisting of acetophenones, benzyl ketals and benzophenones can be preferably used. The acetophenones are diethoxyacetophenone, 2-hydroxy-2-methyl-1-phenylpropan-1-one, 1-(4-isopropylphenyl)-2-hydroxy-2-methylpropan-1-one, 4-(2-hydroxyethoxy)phenyl-(2-hydroxy-2-propyl)ketone and the like. Examples of the benzyl ketals include 1-hydroxycyclohexyl-phenyl ketone, benzyl dimethyl ketal and the like. Examples of the benzophenones include benzophenone, methyl o-benzoylbenzoate and the like. Examples of the benzoins and the like include benzoin, benzoin methyl ether, benzoin isopropyl ether and the like. A kind of the photopolymerization initiators may be used, or two or more kinds thereof may be used in combination.

When the composition is cured using thermal curing and curing by active energy rays in combination, heating and application of active energy rays may be conducted simultaneously or separately. For example, thermal curing may be conducted after the application of active energy rays, or curing by active energy rays may be conducted after thermal curing. Moreover, each of the curing methods may be conducted twice or more in combination, and a curing method may be appropriately selected depending on the application.

<Laminate>

A laminate can be obtained by laminating the cured product of the invention and a substrate.

As the substrate of the laminate, an inorganic material such as a metal or glass, an organic material such as plastic or wood or the like may be timely used depending on the application, and the shape of the laminate may be a plate, a sheet or a three-dimensional shape having a three-dimensional structure. The shape may be any shape which corresponds to the purpose, such as an entirely or partially curved shape. Moreover, the hardness, the thickness and the like of the substrate are not limited. Furthermore, the cured product of the invention may be used as a substrate, and the cured product of the invention may be further laminated.

For applications such as circuit boards and semiconductor package boards, metal foil is preferably laminated. Examples of the metal foil include copper foil, aluminum foil, gold foil, silver foil and the like, and copper foil is preferably used because of the excellent processability.

In the laminate of the invention, the cured product layer may be formed on the substrate by direct coating or formation, or a layer which has been formed already may also be laminated. In the case of direct coating, the coating process is not particularly limited, and examples include a spray process, a spin coating process, a dipping process, a roll coating process, a blade coating process, a doctor roll process, a doctor blade process, a curtain coating process, a slit coating process, a screen printing process, an inkjet process and the like. In the case of direct formation, in-mold forming, insert forming, vacuum forming, extrusion lamination forming, press forming and the like are used.

When a formed composition is laminated, an uncured or semi-cured composition layer may be laminated and then cured, or a cured product layer obtained by completely curing the composition may also be laminated on the substrate.

Moreover, a substrate may be laminated by coating the cured product of the invention with a precursor which can turn into the substrate and curing the precursor, or a precursor which can turn into a substrate or the composition of the invention in an uncured or semi-cured state may be adhered and then cured. The precursor which can turn into a substrate is not particularly limited, and examples include curable resin compositions and the like.

<Fiber-Reinforced Resin>

When the composition of the invention has a fibrous substrate and when the fibrous substrate is reinforcing fibers, the composition containing the fibrous substrate can be used as a fiber-reinforced resin.

The method for adding a fibrous substrate to the composition is not particularly limited within the scope that does not adversely affect the effects of the invention. An example is a method of forming a composite of the fibrous substrate and the composition by a method such as kneading, coating, impregnation, injection or compression, and a method can be timely selected depending on the form of the fibers and the application of the fiber-reinforced resin.

The method for forming the fiber-reinforced resin of the invention is not particularly limited. When a plate product is produced, an extrusion molding process is generally used, but flat surface pressing can also be used. In addition, an extrusion molding process, a blow molding process, a compression molding process, a vacuum forming process, an injection molding process and the like can be used. Moreover, when a film product is produced, a solution casting process can be used in addition to a melt-extrusion process. When a melt-forming process is used, inflation film forming, cast forming, extrusion lamination forming, calendar forming, sheet forming, fiber forming, blow molding, injection molding, rotational molding, coating forming and the like are used. Furthermore, in the case of a resin which cures with active energy rays, a cured product can be produced using a curing method using active energy rays. In particular, when a thermosetting resin is the major component of the matrix resin, a method of forming a prepreg of the forming materials and compressing and heating the prepreg by a press or an autoclave can be used, and in addition to this method, RTM (Resin Transfer Molding), VaRTM (Vaccum assist Resin Transfer Molding), laminate molding, hand lay-up forming and the like are used.

<Prepreg>

The fiber-reinforced resin of the invention can form a state called a prepreg which is uncured or semi-cured. A product in the prepreg state may be distributed, and a cured product may be then formed by final curing. When a laminate is formed, it is preferable to form a prepreg, then laminate other layers and conduct final curing because a laminate in which the layers are closely adhered can be formed.

The mass ratio of the composition and the fibrous substrate used here is not particularly limited, but in general, the ratio is preferably adjusted in a manner that the resin content of the prepreg becomes 20 to 60 mass %.

<Heat-Resistant Material and Electronic Material>

Because the cured product obtained from the composition of the invention has a low linear expansion coefficient and excellent resistance to thermal decomposition, the composition can be suitably used for a heat-resistant member. Moreover, due to the excellent adhesiveness to a substrate, the composition can be particularly suitably used for an electronic member. In particular, the composition can be suitably used for a semiconductor encapsulating material, a circuit board, a buildup film, a buildup board and the like as well as an adhesive and a resist material. Furthermore, the composition can be suitably used also for a matrix resin of a fiber-reinforced resin and is particularly suitable as a highly heat resistant prepreg. A heat-resistant member and an electronic member which are thus obtained can be suitably used for various applications. Examples include industrial machine parts, general machine parts, parts of automobiles/railways/cars/etc., space/aviation-related parts, electronic/electrical parts, building materials, container/packaging materials, household goods, sport/leisure goods, wind power generator housing materials and the like, but the application is not limited to these examples.

Typical products are explained below with examples.

1. Semiconductor Encapsulating Material

A method for obtaining a semiconductor encapsulating material from the composition of the invention is a method of sufficiently melt-mixing the composition, the curing accelerator and a blended agent such as an inorganic filler, using an extruder, a kneader, a roll or the like if necessary, until the materials are uniformly mixed. At this point, fused silica is generally used as the inorganic filler, but when the composition is used for a highly thermally conductive semiconductor encapsulating material for a power transistor or power IC, a high-filling filler having higher thermal conductivity than fused silica, such as crystalline silica, alumina or silicon nitride, or fused silica, crystalline silica, alumina, silicon nitride or the like is preferably used. Regarding the filling factor, the inorganic filler is preferably used in an amount in the range of 30 to 95 mass % based on 100 parts by mass of the curable resin composition, more preferably in an amount of 70 parts by mass or more, further preferably in an amount of 80 parts by mass or more in order to improve the flame retardancy, the moisture resistance and the resistance to soldering cracking and to decrease the linear expansion coefficient.

2. Semiconductor Device

Regarding semiconductor package forming for obtaining a semiconductor device from the curable resin composition of the invention, a method of casting the semiconductor encapsulating material or forming the semiconductor encapsulating material using a transfer molding machine, an injection molding machine or the like and heating at 50 to 250° C. for 2 to 10 hours is used.

3. Printed Circuit Board

A method for obtaining a printed circuit board from the composition of the invention is a method of laminating the prepreg by a general method, appropriately further laminating copper foil and heating and compressing under a pressure of 1 to 10 MPa at 170 to 300° C. for 10 minutes to 3 hours.

4. Buildup Board

Regarding a method for obtaining a buildup board from the composition of the invention, the following steps are used for example. A step of first coating a circuit board to which a circuit has been formed with the composition to which rubber, a filler or the like has been appropriately added using a spray coating process, a curtain coating process or the like and then curing the composition (step 1). A step of then making a hole such as a certain through hole part if necessary, then treating with a roughening agent, washing the surface with warm water to form unevenness and plating with a metal such as copper (step 2). A step of repeating such operations one by one according to the need and building up and forming resin insulating layers and conductor layers of a desired circuit pattern alternately (step 3). In this regard, the through hole part is made after forming the outermost resin insulating layer. Moreover, the buildup board of the invention can also be produced by heating and compressing resin-attached copper foil obtained by semi-curing the resin composition on the copper foil on a wiring board to which a circuit has been formed at 170 to 300° C., without conducting the steps of the rough surface formation and the plating treatment.

5. Buildup Film

Regarding a method for obtaining a buildup film from the composition of the invention, a buildup film can be produced by applying the composition to the surface of a support film (Y) as a substrate and forming a layer (X) of the composition by drying the organic solvent by heating, blowing hot air or the like.

As the organic solvent used here, for example, ketones such as acetone, methyl ethyl ketone and cyclohexanone, acetate esters such as ethyl acetate, butyl acetate, cellosolve acetate, propylene glycol monomethyl ether acetate and carbitol acetate, cellosolve, carbitols such as butyl carbitol, aromatic hydrocarbons such as toluene and xylene, dimethylformamide, dimethylacetamide, N-methylpyrrolidone and the like are preferably used. Moreover, the organic solvent is preferably used at a ratio resulting in a nonvolatile content of 30 to 60 mass %.

The thickness of the layer (X) formed is generally the same as or more than the thickness of the conductor layer. Because the thickness of the conductor layer of a circuit board is generally in the range of 5 to 70 μm, the thickness of the resin composition layer is preferably 10 to 100 μm. In this regard, the layer (X) of the composition in the invention may be protected with a protecting film described below. By protecting with a protecting film, adhesion of contaminants or the like or scratches on the surface of the resin composition layer can be prevented.

Examples of the support film and the protecting film above include polyolefins such as polyethylene, polypropylene and polyvinyl chloride, polyesters such as polyethylene terephthalate (sometimes abbreviated to as "PET" below) and polyethylene naphthalate, polycarbonates and polyimides as well as mold-release paper, metal foil such as copper foil and aluminum foil and the like. In this regard, the support film and the protecting film may be subjected to mold-release treatment in addition to mud treatment and corona treatment. The thickness of the support film is not particularly limited but is generally 10 to 150 μm, and the support film is preferably used with a thickness in the range of 25 to 50 μm. Moreover, the thickness of the protecting film is preferably 1 to 40 μm.

The support film (Y) described above is removed after lamination on a circuit board or after forming an insulating layer by thermally curing. When the support film (Y) is removed after thermally curing the curable resin composition layer which constitutes the buildup film, adhesion of contaminants or the like during the curing step can be prevented. When the support film is removed after curing, the support film is generally subjected to mold-release treatment in advance.

A multilayer printed circuit board can be produced using the buildup film obtained in the above manner. For example, the layer (X) is laminated on one surface or both surfaces of a circuit board in a manner that the layer (X) comes into direct contact with the circuit board, for example by a vacuum lamination process, after removing the protecting film when the layer (X) is protected with a protecting film. The lamination process may be a batch process or a continuous process using rolls. Moreover, if necessary, the buildup film and the circuit board may be heated (preheated) before lamination. Regarding the conditions of lamination, lamination is preferably conducted at a compression temperature (lamination temperature) of preferably 70 to 140° C. at a compression pressure of preferably 1 to 11 kgf/cm$^2$ (9.8×10$^4$ to 107.9×10$^4$ N/m$^2$) and under reduced pressure of air pressure of 20 mmHg (26.7 hPa) or less.

6. Conductive Paste

An example of the method for obtaining a conductive paste from the composition of the invention is a method of dispersing conductive particles in the composition. The conductive paste may be produced as a paste resin composition for circuit connection or an anisotropic conductive adhesive depending on the kind of the conductive particles used.

Next, the invention is more specifically explained with Examples and Comparative Examples, and the "part" and "%" below are based on mass unless otherwise specified.

In this regard, the measurement of high-performance liquid chromatography (HPLC), $^1$H and $^{13}$C-NMR, FD-MS spectra and DSC was under the following conditions.

HPLC: "LC1260" manufactured by Agilent Technologies, Inc.

Analysis conditions: Table 1 below

TABLE 1

| | Time (minute) | | | | | |
|---|---|---|---|---|---|---|
| | 0 | 1.67 | 5.00 | 8.00 | 9.33 | 10.0 |
| Water | 70 | 70 | 10 | 10 | 70 | 70 |
| Acetonitrile | 30 | 30 | 90 | 90 | 30 | 30 |

Detector: photo diode array detector
Flow rate: 1.0 mL/minute
Column used: Poroshell 120 EC-C18
$^1$H-NMR: "JNM-ECA600" manufactured by JEOL RESONANCE
Magnetic field strength: 600 MHz
Cumulative number: 32 times
Solvent: DMSO-d$_6$
Sample concentration: 30 mass %

$^{13}$C-NMR: "JNM-ECA600" manufactured by JEOL RESONANCE

Magnetic field strength: 150 MHz

Cumulative number: 320 times

Solvent: DMSO-d$_6$

Sample concentration: 30 mass %

FD-MS: "JMS-T100GC AccuTOF" manufactured by JEOL Ltd.

Measurement range: m/z=50.00 to 2000.00

Rate of change: 25.6 mA/min

Final current value: 40 mA

Cathode voltage: −10 kV

DSC: "X-DSC7000" manufactured by Hitachi High-Tech Science Corporation

Atmosphere: nitrogen

Heating program: retention at 30° C. for 5 minutes→heating rate 10° C./minute→retention at 350° C. for 2 minutes Synthesis Example 1

Synthesis of Allyl Group-Containing Maleimide Compound A (1) Step of Protecting Amino Group In a 3-L flask having a thermometer, a cooling tube and a stirrer, 150.21 g (0.58 mol) of 2,2-bis(3-amino-4-hydroxyphenyl)propane (BAPA, manufactured by Wakayama Seika Kogyo Co., Ltd.), 1 L of DMF (N,N-dimethylformamide) and 0.45 L of deionized water were put and stirred at room temperature. The reaction solution was heated to 60° C., and then 148.22 g (1.45 mol) of acetic anhydride was slowly dropped. After the completion of dropping, reaction was conducted at 60° C. for two hours, and then the resultant was air-cooled to room temperature. The precipitates were filtered, washed with 2 L of deionized water and then vacuum-dried at 80° C. for 10 hours, and 177.21 g (yield of 89.2%) of the reactant (a-1) in the chemical equation below as a solid was thus obtained.

(2) Allylation Step

In a 3-L flask having a thermometer, a cooling tube and a stirrer, 150.00 g (0.438 mol) of the reactant (a-1) and 2.2 L of acetone were put and stirred. Then, 133.79 g (0.968 mol) of potassium carbonate was added, and the reaction solution was heated to a reflux state. After reflux for one hour, 116.60 g (0.964 mol) of allyl bromide was dropped over one hour. After the completion of dropping, reaction was conducted under reflux for 12 hours, and then the resultant was air-cooled to room temperature. After filtration, the reaction solution was concentrated under reduced pressure and further vacuum-dried at 80° C. for 10 hours, and 177.88 g (yield of 96.1%) of the reactant (a-2) was thus obtained.

[Chem. 31]

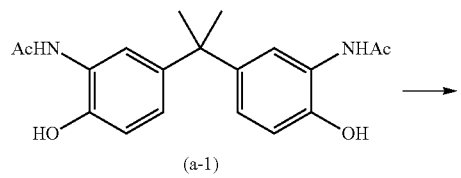

(a-1)

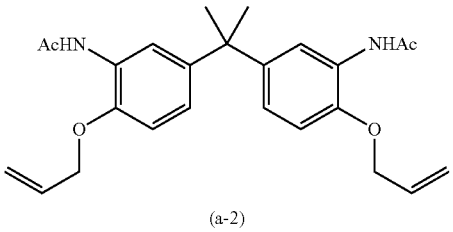

(a-2)

(3) Deprotection Step

In a 1-L flask having a thermometer, a cooling tube and a stirrer, 170.00 g (0.402 mol) of (a-2) and 330 mL of ethanol were put and stirred. Concentrated hydrochloric acid in an amount of 108.97 g was added, and the mixture was heated to 60° C. After reaction at 60° C. for 30 hours, the resultant was air-cooled to room temperature. The reaction solution was neutralized with an aqueous 20% sodium hydroxide solution, followed by extraction with 400 mL of ethyl acetate. The resultant was washed twice with 200 mL of deionized water, dried by adding sodium sulfate and then concentrated under reduced pressure. The obtained reactant was vacuum-dried at 80° C. for 10 hours, and 127.73 g (yield of 93.8%) of the reactant (a-3) as a liquid was thus obtained.

(4) Maleimidation Step

In a 3-L flask having a thermometer, a cooling tube, a Dean-Stark trap and a stirrer, 76.49 g (0.780 mol) of maleic anhydride and 1.8 L of toluene were put and stirred at room temperature. Then, a mixture solution of 120.00 g (0.355 mol) of the reactant (a-3) and 200 mL of DMF was dropped over one hour. After the completion of dropping, the reaction was further conducted at room temperature for two hours. p-Toluenesulfonic acid monohydrate in an amount of 9.82 g was added, and the reaction solution was heated. After cooling and separating water and toluene which were generated as an azeotrope under reflux, only toluene was returned to the system, and dehydration reaction was conducted for eight hours. After air-cooling to room temperature, the resultant was concentrated under reduced pressure, and 274.58 g of a brown solution was thus obtained. The solution was dissolved in 800 mL of ethyl acetate, washed three times with 300 mL of deionized water and three times with 300 mL of an aqueous 2% sodium hydrogen carbonate solution, dried by adding sodium sulfate and then concentrated under reduced pressure. The obtained reactant was vacuum-dried at 80° C. for four hours, and 104.57 g of a crude product containing the allyl group-containing maleimide compound A was thus obtained. The purity of the obtained crude product was 75.0% (HPLC area %, detection wavelength of 275 nm).

By separating and purifying the obtained crude product by silica gel column chromatography (developing solvent: ethyl acetate/hexane =55/45, volume ratio),55.91 g (yield of 31.5%) of the allyl group-containing maleimide compound (A) was obtained.

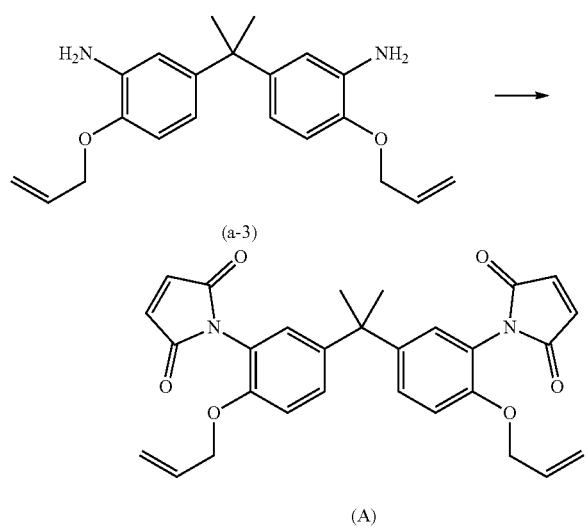

(a-3)

(A)

$^1$H-NMR: δ7.22-7.16(8H), 7.07-7.05(2H), 5.94-5.84(2H), 5.27-5.15(4H), 4.54-4.51(4H), 1.61(6H)

$^{13}$C-NMR: δ169.97 ppm, 151.96 ppm, 142.39 ppm, 134.93 ppm, 133.19 ppm, 128.52 ppm, 128.09 ppm, 119.61 ppm, 116.65 ppm, 112.96 ppm, 68.26 ppm, 41.27 ppm, 30.60 ppm Mass spectrum: M+=498

Melting point (DSC peak top): 134° C.

Purity: 96.7% (HPLC area %, detection wavelength of 275 nm)

Synthesis Example 2

Synthesis of Hydroxy Group-Containing Maleimide Compound (B)

According to the method described in the literature, Polymer Vol. 37 No. 16, 3721-3727; 1996, the hydroxy group-containing maleimide compound (B) was synthesized using 4-aminophenol as a starting material.

[Chem. 33]

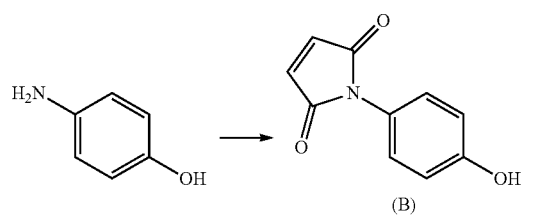

(B)

$^1$H-NMR: δ9.69(1H), 7.13-7.07(4H), 6.85-6.82(2H)

$^{13}$C-NMR: δ170.26 ppm, 156.98 ppm, 134.48 ppm, 128.35 ppm, 122.47 ppm, 115.37 ppm Mass spectrum: M+=189

Melting point (DSC peak top): 187° C.

Purity: 95.0% (HPLC area %, detection wavelength of 275 nm)

Synthesis Example 3

Synthesis of Hydroxy Group-Containing Maleimide Compound (C)

In a 3-L flask having a thermometer, a cooling tube, a Dean-Stark trap and a stirrer, 25.05 g (0.255 mol) of maleic anhydride and 520 mL of toluene were put and stirred at room temperature. Then, a mixture solution of 30.00 g (0.116 mol) of 2,2-bis(3-amino-4-hydroxyphenyl)propane (BAPA, manufactured by Wakayama Seika Kogyo Co., Ltd.) and 80 mL of DMF was dropped over one hour. After the completion of dropping, the reaction was further conducted at room temperature for two hours. p-Toluenesulfonic acid monohydrate in an amount of 2.75 g was added, and the reaction solution was heated. After cooling and separating water and toluene which were generated as an azeotrope under reflux, only toluene was returned to the system, and dehydration reaction was conducted for six hours. After air-cooling to room temperature, the resultant was concentrated under reduced pressure, and 113.77 g of an orange solution was thus obtained. The solution was dissolved in 400 mL of ethyl acetate, washed four times with 100 mL of deionized water and five times with 100 mL of an aqueous 2% sodium hydrogen carbonate solution, dried by adding sodium sulfate and then concentrated under reduced pressure. The obtained reactant was vacuum-dried at 80° C. for 10 hours, and 27.83 g of a crude product containing the hydroxy group-containing maleimide compound (C) was thus obtained.

[Chem. 34]

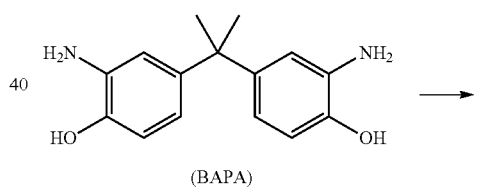

(BAPA)

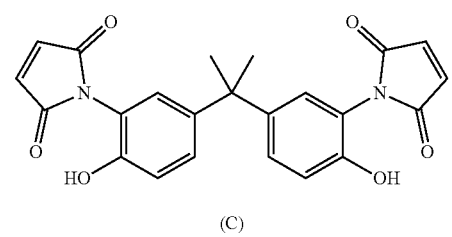

(C)

$^1$H-NMR: δ9.65 (1H), 7.12(4H), 7.05-7.02(4H), 6.85-6.83(2H), 1.54(6H)

$^{13}$C-NMR: δ170.18 ppm, 151.66 ppm, 141.05 ppm, 134.91 ppm, 128.58 ppm, 127.72 ppm, 117.82 ppm, 115.97 ppm, 41.04 ppm, 30.76 ppm Mass spectrum: M+=418

Purity: 85.7% (HPLC area %, detection wavelength of 275 nm)

Example 1

Synthesis of Maleimide Composition (D)

In a 3-L flask having a thermometer, a cooling tube, a Dean-Stark trap and a stirrer, 132.48 g (1.351 mol) of maleic anhydride and 1.53 L of toluene were put and stirred at room temperature. The flask was placed in an ice bath, and a mixture solution of 109.14 g (0.322 mol) of the reactant (a-3), 63.76 g (0.584 mol) of 4-aminophenol and 280 mL of DMF was dropped. After the completion of dropping, the reaction was further conducted at room temperature for two hours. p-Toluenesulfonic acid monohydrate in an amount of 15.27 g was added, and the reaction solution was heated. After cooling and separating water and toluene which were generated as an azeotrope under reflux, only toluene was returned to the system, and dehydration reaction was conducted for nine hours. After air-cooling to room temperature, the resultant was concentrated under reduced pressure, and 553.22 g of a brown solution was thus obtained. The solution was dissolved in 1.4 L of ethyl acetate, washed four times with 400 mL of deionized water and five times with 400 mL of an aqueous 2% sodium hydrogen carbonate solution, dried by adding sodium sulfate and then concentrated under reduced pressure. The obtained reactant was vacuum-dried at 80° C. for 11 hours, and 192.55 g of the maleimide composition (D) containing an allyl group-containing maleimide compound and a hydroxy group-containing maleimide compound was thus obtained.

Example 2

Synthesis of Maleimide Composition (E)

In a 3-L flask having a thermometer, a cooling tube, a Dean-Stark trap and a stirrer, 76.49 g (0.780 mol) of maleic anhydride and 1.8 L of toluene were put and stirred at room temperature. Then, a mixture solution of 120.00 g (0.355 mol) of the reactant (a-3) and 200 mL of DMF was dropped over one hour. After the completion of dropping, the reaction was further conducted at room temperature for two hours. p-Toluenesulfonic acid monohydrate in an amount of 9.82 g was added, and the reaction solution was heated. After cooling and separating water and toluene which were generated as an azeotrope under reflux, only toluene was returned to the system, and dehydration reaction was conducted for eight hours. After air-cooling to room temperature, the resultant was concentrated under reduced pressure, and 274.58 g of a brown solution was thus obtained. The solution was dissolved in 800 mL of ethyl acetate and washed three times with 300 mL of deionized water and three times with 300 mL of an aqueous 2% sodium hydrogen carbonate solution, and 815.4 g of a resin solution (e-1) containing the allyl group-containing maleimide compound (A) was thus obtained. The hydroxy group-containing maleimide compound (B) obtained in Synthesis Example (2) in

[Chem. 35]

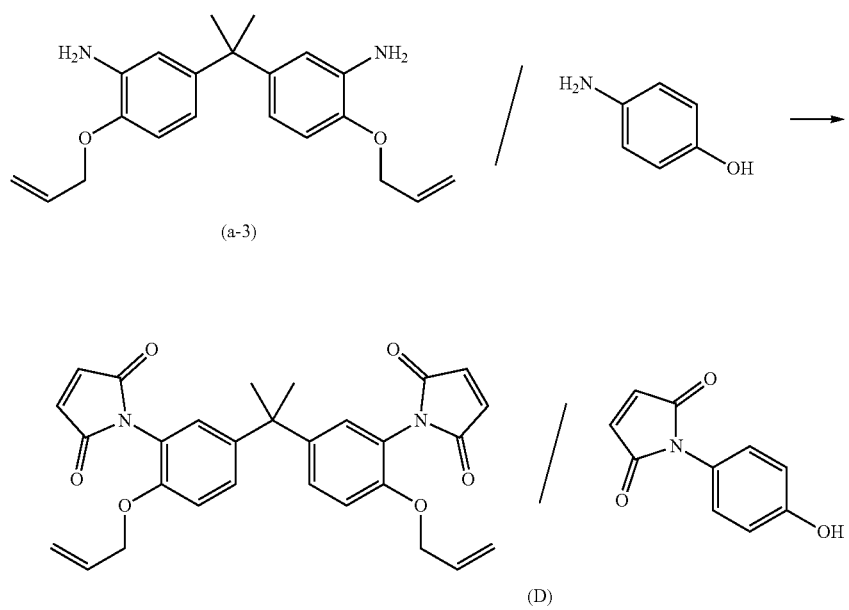

(a-3)

(D)

Because the mass spectrum of the obtained maleimide composition (D) exhibited the peaks of M+=498 and 189, it was found that the aimed maleimidation progressed. Moreover, by $^1$H-NMR, it was found that the ratio of the maleimide components was allyl group-containing maleimide/hydroxy group-containing maleimide=57:43 (weight ratio). To calculate the ratio, the signal derived from the allyl groups of the allyl group-containing maleimide and the an amount of 75.7 g (0.400 mol) was added thereto and stirred, and thus a resin solution in which the allyl group-containing maleimide compound and the hydroxy group-containing maleimide compound were uniformly mixed was obtained. The resin solution was dried by adding sodium sulfate and then concentrated under reduced pressure. The obtained reactant was vacuum-dried at 80° C. for four hours, and 175.2 g of the maleimide composition (E) containing the allyl group-containing maleimide compound and the hydroxy group-containing maleimide compound was thus obtained.

[Chem. 36]

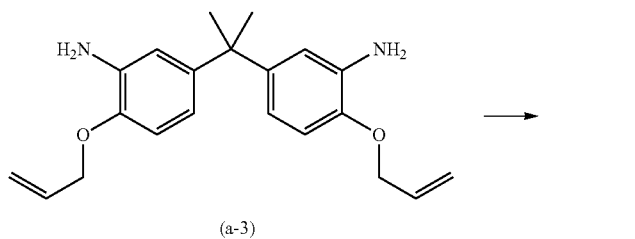

(a-3)

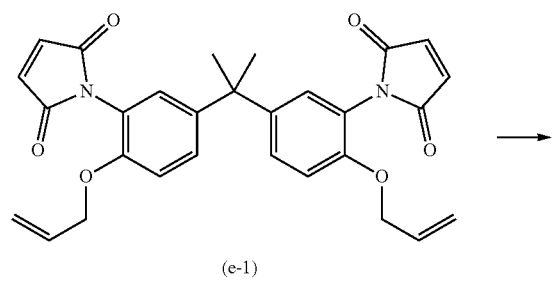

(e-1)

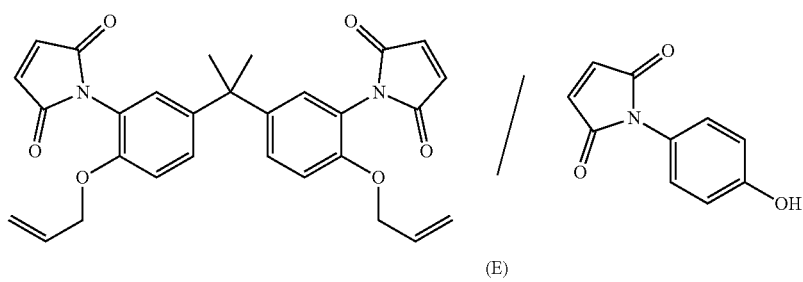

(E)

Because the mass spectrum of the obtained maleimide composition (E) exhibited the peaks of M⁺=498 and 189, it was found that the aimed maleimidation progressed. Moreover, by ¹H-NMR, it was found that the ratio of the maleimide components was allyl group-containing maleimide/hydroxy group-containing maleimide=58:42 (weight ratio). To calculate the ratio, the signal derived from the allyl groups of the allyl group-containing maleimide and the signal derived from the aromatic ring of the hydroxy group-containing maleimide in ¹H-NMR were used.

Example 3

Synthesis of Maleimide Composition (F)

The maleimide composition (F) was obtained by conducting the same operations as those in Example 1 using 3-aminophenol instead of 4-aminophenol in Example 1.

[Chem. 37]

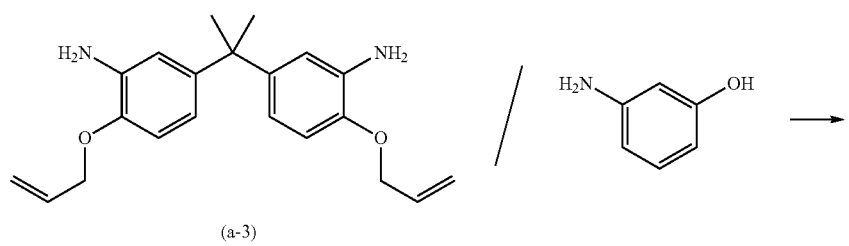

(a-3)

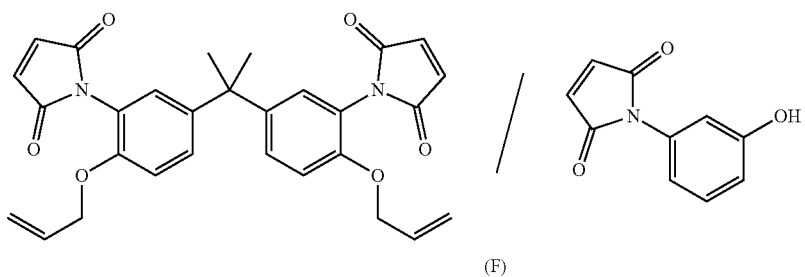

(F)

Because the mass spectrum of the obtained maleimide composition (F) exhibited the peaks of M+=498 and 189, it was found that the aimed maleimidation progressed. Moreover, by $^1$H-NMR, it was found that the ratio of the maleimide components was allyl group-containing maleimide/hydroxy group-containing maleimide=60:40 (weight ratio). To calculate the ratio, the signal derived from the allyl groups of the allyl group-containing maleimide and the signal derived from the aromatic ring of the hydroxy group-containing maleimide in $^1$H-NMR were used.

Example 4

Synthesis of Maleimide Composition (G)

In a 3-L flask having a thermometer, a cooling tube, a Dean-Stark trap and a stirrer, 118.65 g (1.210 mol) of maleic anhydride and 1.0 L of toluene were put and stirred at room temperature. The flask was placed in an ice bath, and a mixture solution of 122.97 g (0.363 mol) of the reactant (a-3), 40.86 g (0.374 mol) of 4-aminophenol and 190 mL of DMF was dropped. After the completion of dropping, the reaction was further conducted at room temperature for two hours. p-Toluenesulfonic acid monohydrate in an amount of 14.12 g was added, and the reaction solution was heated. After cooling and separating water and toluene which were generated as an azeotrope under reflux, only toluene was returned to the system, and dehydration reaction was conducted for nine hours. The same separation step as that in Example 1 was conducted, and 169.92 g of a maleimide composition (G) was thus obtained.

Because the mass spectrum of the obtained maleimide composition (G) exhibited the peaks of M+=498 and 189, it was found that the aimed maleimidation progressed. Moreover, by $^1$H-NMR, it was found that the ratio of the maleimide components was allyl group-containing maleimide/hydroxy group-containing maleimide=70:30 (weight ratio). To calculate the ratio, the signal derived from the allyl group of the allyl group-containing maleimide and the signal derived from the aromatic ring of the hydroxy group-containing maleimide in $^1$H-NMR were used.

Example 5

Synthesis of Maleimide Composition (H)

The reactant (h-1) was synthesized according to the method described in the literature, Proceedings of the National Academy of Sciences, India, Section A: Physical Sciences, 71(1), 5-12; 2001.

[Chem. 38]

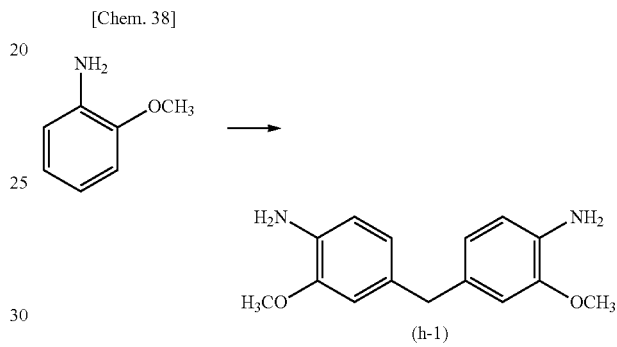

In a 3-L flask having a thermometer, a cooling tube and a stirrer, 60.00 g (0.232 mol) of the reactant (h-1), 800 mL of acetic acid and 800 mL of hydrobromic acid (47%) were put and heated to a reflux state while stirring. After reaction under reflux for 12 hours, the resultant was air-cooled to room temperature. The reaction solution was neutralized with an aqueous 20% sodium hydroxide solution, followed by extraction with 600 mL of ethyl acetate. The resultant was washed three times with 200 mL of deionized water, dried by adding sodium sulfate and then concentrated under reduced pressure, and 43.01 g (yield of 80.5%) of the reactant (h-2) was thus obtained.

[Chem. 39]

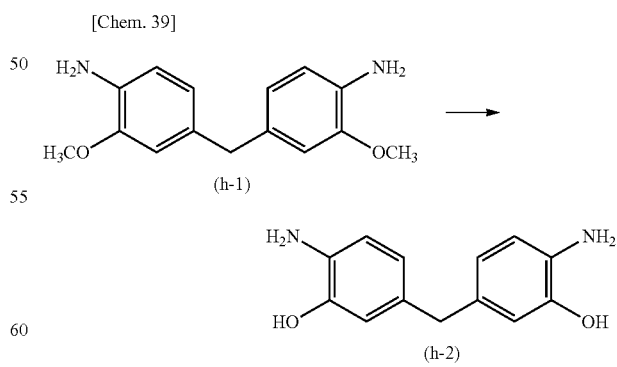

The allyl group-containing amine compound (h-3) was obtained by conducting the same operations as those in Synthesis Example 1(1) to (3) using the reactant (h-2) instead of BAPA in Synthesis Example 1.

[Chem. 40]

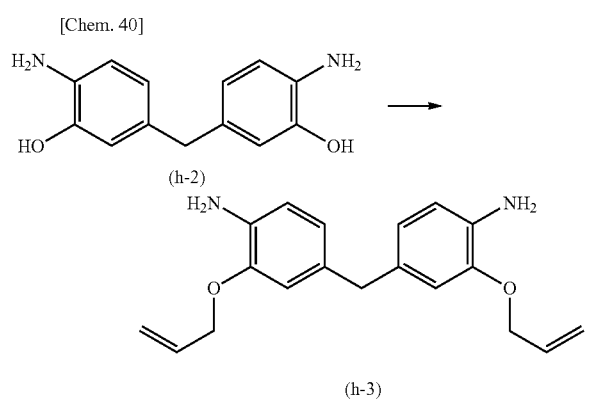

The maleimide composition (G) was obtained by conducting the same operations as those in Example 1 using the reactant (h-3) instead of the reactant (a-3) in Example 1.

[Chem. 41]

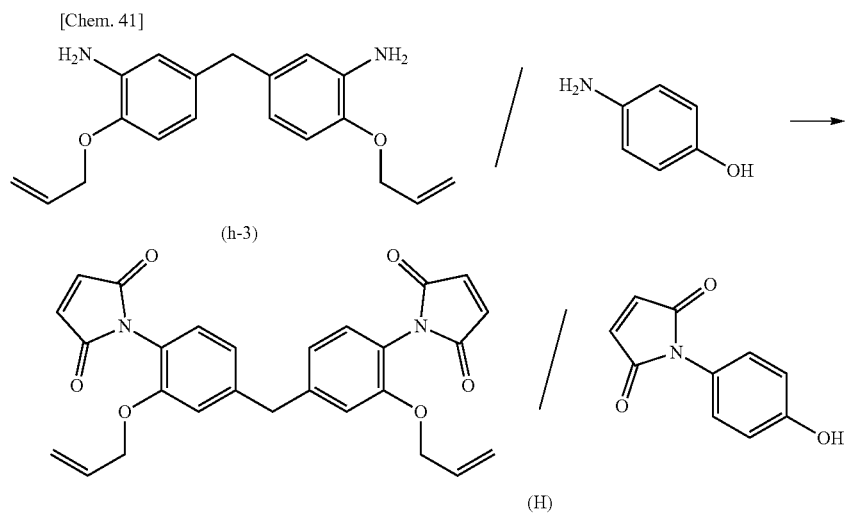

Because the mass spectrum of the obtained maleimide composition (H) exhibited the peaks of $M^+=470$ and 189, it was found that the aimed maleimidation progressed. Moreover, by $^1$H-NMR, it was found that the ratio of the maleimide components was allyl group-containing maleimide/hydroxy group-containing maleimide=72:28 (weight ratio). To calculate the ratio, the signal derived from the allyl groups of the allyl group-containing maleimide and the signal derived from the aromatic ring of the hydroxy group-containing maleimide in $^1$H-NMR were used.

<Evaluation of Resin Cured Product>
(1) Production of Composition

The allyl group-containing maleimide compound and the hydroxy group-containing maleimide compounds obtained in Synthesis Examples 1 to 3, the maleimide compositions obtained in Examples 1 to 5, epoxy resins, a phenolic resin, bismaleimide for comparison and a catalyst were blended at the proportions shown in Table 2 to Table 5 bp pulverizing and mixing with a mortar, and compositions were prepared.

<Melt Viscosity of Maleimide Component>

Regarding the melt viscosity of a maleimide component, the viscosity at 150° C. was measured using a dynamic viscoelasticity measuring device ("ARES" manufactured by TA instruments).

<Gel Time of Resin Composition>

The gel times (tack disappearing times) of the compositions blended at the proportions shown in Table 2 to Table 5 were measured at 200° C.

(2) Production of Cured Product

The prepared compositions were heated under the following conditions, and resin cured products were thus obtained.

Curing conditions: A resin composition was put into a form to which copper foil having a thickness of 18 μm ("JTCSLC-18μ" manufactured by JX Nippon Mining & Metals Corporation, untreated surface) had been placed, and a cured product was obtained by press forming by heating at 200° C. for two hours and at 250° C. for two hours.

Thickness of cured product: 2 mm

The physical properties of the cured products were evaluated by the following methods. The results are shown in Tables 2 and 3.

<Glass Transition Temperature>

A piece having a size of a width of 5 mm and a length of 50 mm was cut out of a cured product having a thickness of 2 mm and used as a test piece. Regarding the test piece, the temperature at which the change in the elastic modulus was the largest (the tan δ change rate was the largest) was measured using a viscoelasticity measuring device (DMA: a solid viscoelasticity measuring device "DMS7100" manufactured by Hitachi High-Tech Science Corporation, deformation mode: dual cantilever bending, measurement mode: sinusoidal oscillation, frequency $^1$ Hz, heating rate 3° C./minute) and determined as the glass transition temperature.

<Resistance to Thermal Decomposition>

A cured product having a thickness of 2 mm was cut into fine pieces, and the measurement was conducted using a thermogravimetric analyzer ("TG/DTA6200" manufactured by SII Nanotechnology Inc.) at a heating rate of 5° C./minute in a nitrogen atmosphere. The temperature at which the weight decreased by 5% (Td5) was determined.

<Metal Adhesiveness>

A piece having a size of a width of 10 mm and a length of 70 mm was cut out of a cured product having a thickness of 2 mm to which copper foil was adhered, and this piece was used as a test piece. The peeling strength of the test piece in the 90° direction was evaluated (test speed: 50 mm/min) with a tensile tester ("Tensilon RTC" manufactured by A&D Company, Limited).

TABLE 2

|  | Example 6 | Example 7 | Example 8 | Example 9 | Example 10 | Example 11 |
|---|---|---|---|---|---|---|
| Allyl group-containing maleimide compound (A) |  | 45 |  |  |  |  |
| Hydroxy group-containing maleimide compound (B) |  | 30 |  |  |  |  |
| Hydroxy group-containing maleimide compound (C) |  |  |  |  |  |  |
| Maleimide composition (D) | 100 |  | 75 |  |  |  |
| Maleimide composition (E) |  |  |  | 75 |  |  |
| Maleimide composition (F) |  |  |  |  | 75 |  |
| Maleimide composition (G) |  |  |  |  |  | 81 |
| Maleimide composition (H) |  |  |  |  |  |  |
| HP-4700 |  | 25 | 25 | 25 | 25 | 19 |
| N-655-EXP-S |  |  |  |  |  |  |
| HP-6000 |  |  |  |  |  |  |
| TPP |  | 0.5 | 0.5 | 0.5 | 0.5 | 0.4 |
| Maleimide content of composition (%) | 100 | 75 | 75 | 75 | 75 | 81 |
| Evaluation of resin |  |  |  |  |  |  |
| Maleimide component 150° C. melt viscosity (dPa · s) | 0.4 | Did not melt. | 0.4 | 0.5 | 0.4 | 0.6 |
| Gel time of composition at 200° C. (sec) | >600 | 108 | 76 | 82 | 62 | 107 |
| Evaluation of cured product |  |  |  |  |  |  |
| Glass transition temperature (° C.) | >360 | >360 | >360 | >360 | >360 | >360 |
| Temperature of thermal decomposition resistance (Td5, ° C.) | 435 | 376 | 385 | 381 | 375 | 392 |
| Copper foil adhesiveness (N/10 mm) | 0.3 | 1.1 | 1.7 | 1.7 | 2.4 | 1.7 |

TABLE 3

|  | Example 12 | Example 13 | Example 14 | Example 15 |
|---|---|---|---|---|
| Allyl group-containing maleimide compound (A) |  | 34 | 49 | 45 |
| Hydroxy group-containing maleimide compound (B) |  | 34 | 29 |  |
| Hydroxy group-containing maleimide compound (C) |  |  |  | 30 |
| Maleimide composition (D) |  |  |  |  |
| Maleimide composition (E) |  |  |  |  |
| Maleimide composition (F) |  |  |  |  |
| Maleimide composition (G) |  |  |  |  |
| Maleimide composition (H) | 81 |  |  |  |
| HP-4700 | 19 |  |  | 25 |
| N-655-EXP-S |  | 32 |  |  |
| HP-6000 |  |  | 22 |  |
| TPP | 0.4 | 0.6 | 0.5 | 0.5 |
| Maleimide content of composition (%) | 81 | 68 | 71 | 75 |
| Evaluation of resin |  |  |  |  |
| Maleimide component 150° C. melt viscosity (dPa · s) | 0.9 | Did not melt. | Did not melt. | Did not melt. |
| Gel time of composition at 200° C. (sec) | 40 | 82 | 167 | 88 |
| Evaluation of cured product |  |  |  |  |
| Glass transition temperature (° C.) | >360 | 288 | 311 | >360 |
| Temperature of thermal decomposition resistance (Td5, ° C.) | 380 | 375 | 395 | 379 |
| Copper foil adhesiveness (N/10 mm) | 1.7 | 1.5 | 1.7 | 0.9 |

TABLE 4

| | Comparative Example 1 | Comparative Example 2 | Comparative Example 3 | Comparative Example 4 |
|---|---|---|---|---|
| Allyl group-containing maleimide compound (A) | | 100 | | |
| Hydroxy group-containing maleimide compound (B) | | | 100 | 33 |
| BMI-1000 | 100 | | | 67 |
| HP-4700 | | | | |
| N-655-EXP-S | | | | |
| TD-2131 | | | | |
| TPP | | | | |
| Maleimide content of composition (%) | 100 | 100 | 100 | 100 |
| Evaluation of resin | | | | |
| Maleimide component 150° C. melt viscosity (dPa · s) | Did not melt. | 1.3 | Did not melt. | Did not melt. |
| Gel time of composition at 200° C. (sec) | >600 | >600 | — | >600 |
| Evaluation of cured product | | | | |
| Glass transition temperature (° C.) | >360 | >360 | — | >360 |
| Temperature of thermal decomposition resistance (Td5, ° C.) | 481 | 432 | — | 430 |
| Copper foil adhesiveness (N/10 mm) | Did not adhere. | 0.1> | — | Did not adhere. |

TABLE 5

| | Comparative Example 5 | Comparative Example 6 | Comparative Example 7 | Comparative Example 8 |
|---|---|---|---|---|
| Allyl group-containing maleimide compound (A) | 60 | | | 50 |
| Hydroxy group-containing maleimide compound (B) | | 53 | 30 | |
| BMI-1000 | | | 45 | |
| HP-4700 | 40 | 47 | 25 | |
| N-655-EXP-S | | | | 33 |
| TD-2131 | | | | 17 |
| TPP | | 1 | 0.6 | 0.5 |
| Maleimide content of composition (%) | 60 | 53 | 75 | 50 |
| Evaluation of resin | | | | |
| Maleimide component 150° C. melt viscosity (dPa · s) | 1.3 | Did not melt. | Did not melt. | 1.3 |
| Gel time of composition at 200° C. (sec) | >600 | 168 | 158 | 75 |
| Evaluation of cured product | | | | |
| Glass transition temperature (° C.) | 250 | 334 | 358 | 194 |
| Temperature of thermal decomposition resistance (Td5, ° C.) | 340 | 362 | 365 | 377 |
| Copper foil adhesiveness (N/10 mm) | 0.3 | Did not adhere. | Did not adhere. | 0.2 |

The materials used in the tables are as follows.

BMI-1000: 4,4'-diphenylmethane bismaleimide (manufactured by Daiwa Kasei Industry Co., Ltd.)

N-655-EXP-S: cresol novolak-type epoxy resin (manufactured by DIC Corporation)

HP-4700: naphthalene-type epoxy resin (manufactured by DIC Corporation)

HP-6000: naphthylene ether-type epoxy resin (manufactured by DIC Corporation)

TD-2131: phenol novolak (manufactured by DIC Corporation)

TPP: triphenylphosphine (manufactured by Hokko Chemical Industry Co., Ltd.)

As shown by Comparative Example 1 and Comparative Example 2, sufficient adhesiveness could not be obtained with the cured products obtained from one maleimide compound alone. In particular, as shown by Comparative Example 1, when the cured product was obtained from only one maleimide compound containing no allyl group, the copper foil peeled off immediately after the production of the cured product, and the adhesiveness could not be measured.

In Comparative Example 3, the resin volatilized during curing, and a cured product could not be produced.

As shown by Comparative Example 4, Comparative Example 6 and Comparative Example 7, when the maleimides in the compositions contained no allyl group, the copper foil peeled off immediately after the production of the cured products, and the adhesiveness could not be measured.

As shown by Comparative Example 5 and Comparative Example 8, when the compositions did not contain any hydroxy group-containing maleimide compound, the results were with a low glass transition temperature and a low temperature of thermal decomposition resistance.

<Production of Laminated Plate>

Compositions were prepared by blending compounds and a catalyst at the proportions shown in Table 6. The nonvolatile contents of the compositions were adjusted to 58 mass % with methyl ethyl ketone, and resin composition solutions were thus obtained. Laminated plates were produced under the following conditions.

Substrate: glass cloth "#2116" manufactured by Nitto Boseki Co., Ltd. (210×280 mm)

Number of plies: 6

Conditions for prepreg formation: 160° C., 3 minutes

Curing conditions: 1.5 hours at 200° C. at 40 kg/cm2, thickness after molding: 0.8 mm <Gel Time of Resin Composition>

The gel times (tack disappearing times) of the resin compositions blended at the proportions shown in Table 6 were measured at 160° C.

<Glass Transition Temperature>

A cured product having a thickness of 0.8 mm with a size of a width of 5 mm and a length of 50 mm was cut out of each laminated plate and used as a test piece. Regarding the test piece, the temperature at which the change in the elastic modulus was the largest (the tan δ change rate was the largest) was measured using a viscoelasticity measuring device (DMA: a solid viscoelasticity measuring device "DMS7100" manufactured by Hitachi High-Tech Science Corporation, deformation mode: dual cantilever bending, measurement mode: sinusoidal oscillation, frequency $^1$ Hz, heating rate 3° C./minute) and determined as the glass transition temperature.

<Bending Strength>

A cured product having a thickness of 0.8 mm with a size of a width of 15 mm and a length of 100 mm was cut out of each laminated plate, and the piece was used as a test piece and evaluated in accordance with JIS-K7107.

<Tensile Strength>

A cured product having a thickness of 0.8 mm with a size of a width of 15 mm and a length of 120 mm was cut out of each laminated plate, and the piece was used as a test piece and evaluated in accordance with JIS-K7165.

TABLE 6

|  | Example 16 | Comparative Example 9 |
|---|---|---|
| Maleimide composition (D) | 75 |  |
| HP-4700 | 25 |  |
| N-680 |  | 67 |
| TD-2090 |  | 33 |
| 2E4MZ | 0.2 | 0.04 |
| Evaluation of resin |  |  |
| Gel time of composition at 160° C. (sec) | 392 | 397 |

TABLE 6-continued

|  |  | Example 16 | Comparative Example 9 |
|---|---|---|---|
| Evaluation of cured product |  |  |  |
| Glass transition temperature (° C.) |  | 341 | 220 |
| Bending strength | Maximum point stress (MPa) | 590 | 420 |
|  | Maximum distortion (%) | 2.9 | 2.9 |
|  | Elastic modulus (GPa) | 23.33 | 16.52 |
| Tensile strength | Maximum point stress (MPa) | 350 | 250 |
|  | Maximum distortion (%) | 3.3 | 3.3 |
|  | Elastic modulus (GPa) | 13.89 | 11.35 |

The materials used in the table are as follows.

HP-4700: naphthalene-type epoxy resin (manufactured by DIC Corporation)

N-680: cresol novolak-type epoxy resin (manufactured by DIC Corporation)

TD-2090: phenol novolak (manufactured by DIC Corporation) 2E4MZ: 2-ethyl-4-methylimidazole (manufactured by Shikoku Chemicals Corporation)

As shown by Example 12, regarding both of the bending strength and the tensile strength, the glass transition temperature and the mechanical strength were higher than those of the conventional epoxy cured product.

INDUSTRIAL APPLICABILITY

The composition of the invention has a low viscosity, and a cured product thereof has a high glass transition temperature, excellent resistance to thermal decomposition and high adhesiveness. Therefore, the composition can be suitably used for a heat-resistant member and an electronic member. The composition can be particularly suitably used for a semiconductor encapsulating material, a circuit board, a buildup film, a buildup board and the like as well as an adhesive and a resist material. Moreover, the composition can be suitably used also for a matrix resin of a resin and is particularly suitable as a highly heat-resistant prepreg.

The invention claimed is:

1. A composition comprising a (meth)allyl group-containing maleimide compound represented by formula (1) below and a hydroxy group-containing maleimide compound represented by formula (4) below:

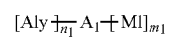

(1)

wherein $n_1$ and $m_1$ are each independently an integer of 1 to 5,

Aly is a group having a (meth)allyl group represented by formula (2) below,

MI is a group having a maleimide group represented by formula (3) below, and $A_1$ is a structure having one or more benzene rings,

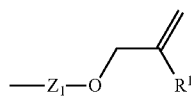 (2)

wherein $Z_1$ is a direct bond or a hydrocarbon group having 1 to 10 carbon atoms which may have a substituent, and $R^1$ represents a hydrogen atom or a methyl group,

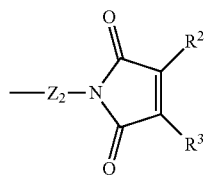 (3)

wherein $Z_2$ is a direct bond or a hydrocarbon group having 1 or 2 carbon atoms which may have a substituent, and $R^2$ and $R^3$ each independently represent a hydrogen atom or a methyl group,

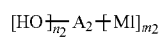 (4)

wherein $n_2$ and $m_2$ are each independently an integer of 1 to 5,

MI is a group having a maleimide group represented by formula (3) above, and $A_2$ is a structure having one or more benzene rings.

2. The composition according to claim 1, wherein in general formula (1) above, $A_1$ is any one of the structures shown in formula (5) below:

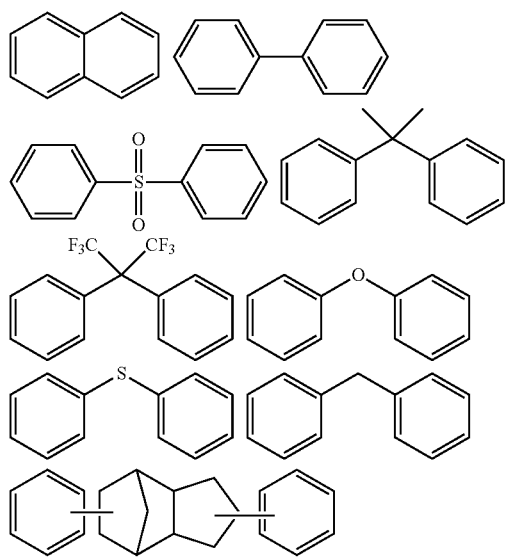

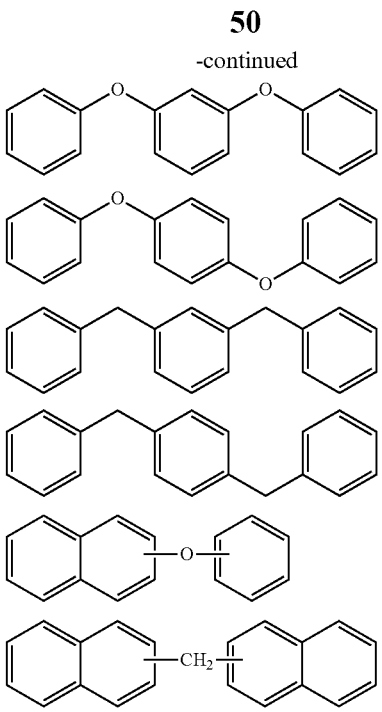

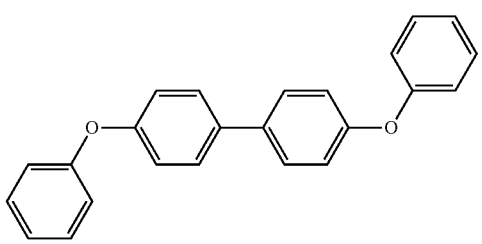

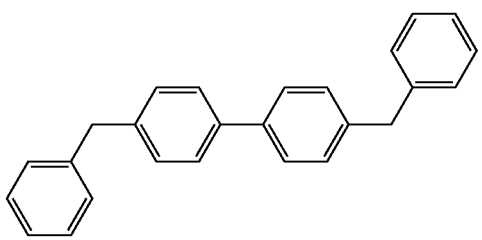

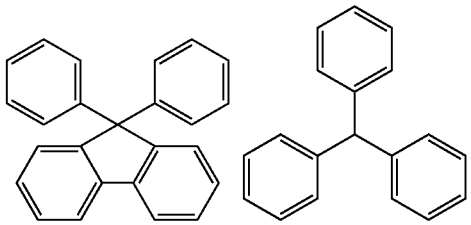

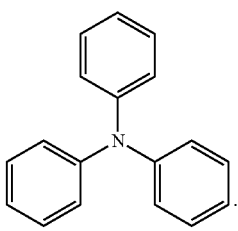

3. The composition according to claim 1, wherein in general formula (4) above, $A_2$ is a benzene ring structure, and $n_2$ and $m_2$ are both 1.

4. The composition according to claim 1, further comprising an epoxy compound.

5. The composition according to claim 1, further comprising a filler.

6. The composition according to claim 1, further comprising a fibrous substrate.

7. A cured product comprising a product obtained by curing the composition according to claim 1.

8. A method for producing a composition comprising a (meth)allyl group-containing compound and a hydroxy group-containing maleimide compound, the method comprising:
a step of producing an aromatic amino compound mixture by mixing a (meth)allyl group-containing amino compound represented by formula (6) below and a hydroxy group-containing amino compound represented by formula (9) below; and
a step of maleimidating the aromatic amino compound mixture:

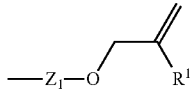 (6)

wherein $n_1$ and $m_1$ are each independently an integer of 1 to 5,
Aly is a group having a (meth)allyl group represented by formula (7) below,
$B_1$ is a group having an amino group represented by formula (8) below, and
$A_1$ is a structure having one or more benzene rings,

 (7)

wherein $Z_1$ is a direct bond or a hydrocarbon group having 1 to 10 carbon atoms which may have a substituent, and $R^1$ represents a hydrogen atom or a methyl group,

—$Z_2$—$NH_2$  (8)

wherein $Z_2$ is a direct bond or a hydrocarbon group having 1 or 2 carbon atoms which may have a substituent, and $R^2$ and $R^3$ each independently represent a hydrogen atom or a methyl group,

 (9)

wherein $n_2$ and $m_2$ are each independently an integer of 1 to 5,
$B_2$ is a group having an amino group represented by formula (8) above, and
$A_2$ is a structure having one or more benzene rings.

9. A method for producing a composition comprising a (meth)allyl group-containing compound and a hydroxy group-containing maleimide compound, the method comprising:
a step of producing a mixture solution by mixing a (meth)allyl group-containing maleimide compound represented by formula (1) above, a hydroxy group-containing maleimide compound represented by formula (4) above and a solvent, and
a step of removing the solvent from the obtained mixture solution.

10. A cured product comprising a product obtained by curing the composition according to claim 2.

11. A cured product comprising a product obtained by curing the composition according to claim 3.

12. A cured product comprising a product obtained by curing the composition according to claim 4.

13. A cured product comprising a product obtained by curing the composition according to claim 5.

14. A cured product comprising a product obtained by curing the composition according to claim 6.

* * * * *